(12) United States Patent
Coombs

(10) Patent No.: US 8,252,726 B2
(45) Date of Patent: Aug. 28, 2012

(54) METHOD FOR CHANGING MAGNETISATION OF A SUPERCONDUCTOR

(75) Inventor: Timothy Arthur Coombs, Cambridge (GB)

(73) Assignee: Magnifye Limited, Cambridgeshire (GB)

( * ) Notice: Subject to any disclaimer, the term of this patent is extended or adjusted under 35 U.S.C. 154(b) by 1046 days.

(21) Appl. No.: 12/066,374

(22) PCT Filed: Oct. 20, 2006

(86) PCT No.: PCT/GB2006/050341
§ 371 (c)(1),
(2), (4) Date: Apr. 4, 2008

(87) PCT Pub. No.: WO2007/045929
PCT Pub. Date: Apr. 26, 2007

(65) Prior Publication Data
US 2008/0252404 A1    Oct. 16, 2008

(30) Foreign Application Priority Data
Oct. 21, 2005  (GB) .................................. 0521473.9

(51) Int. Cl.
*H01L 39/24*    (2006.01)

(52) U.S. Cl. ........................................ 505/400; 505/914
(58) Field of Classification Search .................. 505/400, 505/480, 705, 727, 803, 879, 881, 914, 924
See application file for complete search history.

(56) References Cited

U.S. PATENT DOCUMENTS 3,602,854 A    8/1971    Kawabe et al.
4,973,874 A    11/1990   Carr, Jr.

FOREIGN PATENT DOCUMENTS

GB    1 014 527      12/1965
JP    08256486 A     1/1996

OTHER PUBLICATIONS

International Search Report for WO 2007/045929 A2 completed Mar. 21, 2007 by Jan Gols of the EPO.
Office Action issued for corresponding CN 200680038693.7 dated Jul. 14, 2010.

*Primary Examiner* — Edward Johnson

(57) ABSTRACT

This invention relates to methods and apparatus for magnetizing a superconductor, in particular to flux pumps, and to new types magnetized superconductor. A method of changing the magnetisation of a superconductor, the method comprising automatically controlling a magnetic field to generate a wave of changing magnetic flux travelling over a surface of said superconductor.

11 Claims, 22 Drawing Sheets

Second pump - Step 1

Second pump - Step 2

End of the Second pump 10 pumps 150 pumps

METHOD FOR CHANGING MAGNETISATION OF A SUPERCONDUCTOR

This invention relates mainly to methods and apparatus for magnetizing a superconductor, in particular to flux pumps, and to new types of magnetized superconductor.

The concept of a superconducting flux pump is relatively straightforward. A small magnetic field repeatedly applied will lead to a much larger field being trapped within the superconductor. This field is limited by the volume of the superconductor and by its critical current but not by the excitation field. As long as the superconductor is kept cold the field will persist without the need for an externally applied current.

Here we will describe new techniques which, in embodiments, facilitate creation of high magnetic fields, for example in the range of 1 Tesla and greater. Furthermore, in embodiments the magnetisation may be substantially perpendicular to an essentially planar magnet. In still other embodiments the magnets may be magnetized in a range of desired field patterns, optionally varying in both time and space, for example, to create a uniform field or a travelling wave field.

In broad terms embodiments of the techniques we describe employ a medium, typically a superconductor, to "store" the magnetic field. Actuation of the medium so that it is magnetic is, in embodiments, provided by materials which can change their magnetic state, for example, going from paramagnetic to either ferromagnetic or diamagnetic. When they change their magnetic states then the change in magnetic field induces currents in the superconductor, magnetizing (or de-magnetizing) the superconductor. Embodiments of the techniques we describe, for example, embodiments of the geometry and/or methods described, have a very wide range of potential applications.

According to a first aspect of the invention there is provided a method of changing the magnetisation of a superconductor, the method comprising automatically controlling a magnetic field to generate a wave of changing magnetic flux travelling over a surface of said superconductor.

Preferably the method comprises repeatedly applying the travelling wave of magnetic flux to the superconductor. In this way each pass of the travelling wave can store incrementally more magnetic flux in the superconductor by generating persistent currents. In embodiments the wave of magnetic flux applies a field of greater than a critical field of the superconductor, for example in a type I superconductor the first (and only) critical field. If a type I superconductor is employed the travelling magnetic field should be sufficient to drive a flux line through the superconductor; such a flux line may then be swept to a region in the superconductor, for example to the middle of the superconductor.

In preferred embodiments of the method the superconductor comprises a type II superconductor and the magnetic flux is greater than the first critical field (HC1) of the superconductor. Typically HC1 is small, for example around 20 mT, but embodiments of this technique allow the superconductor to be magnetized, at least in principle, up to the second critical field (HC2), which may be greater than 1, 5 or 10 Tesla, for example up to 40 or 50 Tesla. In the practice the repulsive forces generated by such a large field (that is resulting from two parallel currents) would cause a large stress and, particularly with high temperature superconducting material some form of mechanical constraint may be desirable at the upper limit of the range.

The invention may be employed for either magnetizing or de-magnetizing a superconductor, or for dynamically changing the magnetisation of a superconductor, depending upon whether the travelling wave of magnetic flux (that is the travelling wave magnetic field) is applied to build up or decrease the magnetisation of the superconductor. When magnetizing a superconductor the field is controlled so that after each sweep of magnetic flux over the surface of a superconductor flux is trapped within the superconductor, and in this way a very large field can be built up in a superconductor using multiple sweeps of a relatively small field.

In principle the travelling wave may be generated by a set of coils but, preferably, a solid-state approach is employed. Thus in preferred embodiments the automatic controlling of the magnetic field comprises controlling a wave of magnetic ordering in a layer of magnetizable material over the superconductor surface. The skilled person will appreciate that the magnetizable material need not be in contact with the surface and, as described later, there can be advantages in separating the magnetizable material from the superconductor surface; however, preferably the magnetizable material is sufficiently close to the superconductor surface for there to be significant flux linkage between the two, so that efficiency is increased. The layer of magnetizable material preferably has similar dimensions to the superconductor and may therefore have a thickness ranging from micrometres to millimetres or more. In some preferred embodiments thick or thin film technology is employed.

The magnetic ordering may comprise any of a wide range of known types of magnetic ordering including, but not limited to, ferromagnetism, ferromagnetism, diamagnetism, and variants of these such as canted, helical, reduced dimensionality, and other types of magnetic ordering. Broadly speaking, however, the wave of magnetic ordering comprises a wave of some type of magnetic alignment. For example the travelling wave may comprise a travelling pulse of magnetic ordering, or a pulse of absence of ordering in an otherwise ordered material—since it is a change in magnetic flux which is desired.

The magnetizable material need not itself generate a substantial magnetic field; instead embodiments of the technique may rely upon concentration of an external or separately applied magnetic field locally in the superconductor by creating a region of reduced (or equivalently increased) reluctance in the magnetizable material. Thus the magnetic ordering may comprise ordering providing a low reluctance path to locally increase an external applied field.

In some particularly preferred embodiments heating (or cooling) of an electrical conductor is used to generate a travelling thermal wave by applying a pulse of current to the conductor. The characteristics of the conductor (resistivity, dimensions) and/or magnitude of applied current are chosen so that, for the particular configuration employed, the thermal wave controls the magnetic ordering. Thus, for example, a pulse of current may generate a pulse of heat flowing along the conductor which, in turn, generates a pulse of magnetic disordering in an otherwise ordered material by locally heating the material to above a Curie point of the material. It has been found that Prussian Blue (and its analogues) is one example of a suitable magnetic material, although the skilled person will appreciate that there are many others. Selection of a material may be made, for example, depending upon the magnitude of the thermal wave and/or the critical temperature at which the superconductor becomes superconducting. In embodiments, however, the ordering occurs at an ordering temperature and the thermal wave produces a temperature change in the material which transitions from one side to the other side of this ordering temperature.

In a related aspect the invention provides a method of magnetizing a superconductor, the method comprising repeatedly applying a magnetic field of greater than a critical field of said superconductor to said superconductor.

In some preferred embodiments of this method the superconductor is magnetized such that it has a magnetic moment at least 50% greater than the applied magnetic field. However it will be appreciated that, by means of repeated applications, the magnetic moment of the superconductor may be raised to two, five, 10 or 100 times or more the repeatedly applied field.

In a complementary aspect the invention provides a system for magnetizing a superconductor, the system comprising apparatus to generate a wave of changing magnetic flux travelling over a surface of said superconductor.

Preferably, therefore, the apparatus includes a control system to control magnetic ordering in the material to generate the travelling wave. In particular the control system may be configured to generate a travelling thermal wave to generate a travelling wave of magnetic order in the material. Thus the control system may comprise, for example, an electrical conductor driven by a current source which may be configured to output a current drive waveform such as a current drive pulse.

In a further related aspect the invention provides a system for magnetizing a superconductor, the system comprising means for repeatedly applying a magnetic field of greater than a critical field of said superconductor to said superconductor.

As described above, the magnetic field may be repeatedly applied by controlling magnetic ordering in a layer of magnetizable material such as Prussian Blue or one of its analogues. Although in preferred embodiments a thermal wave is used to control the magnetisation, some magnetizable materials, including some of the Prussian Blue analogues listed later, can be switched using light, for example a laser. Thus in other embodiments of the above described methods and systems the changing magnetic field is applied to the superconductor by applying a changing pattern of light to the magnetizable material, for example by sweeping a laser across the material.

In another aspect the invention provides a superconducting flux pump, the flux pump comprising: a layer of superconducting material; a layer of magnetic material over said layer of superconducting material thermally switchable between two magnetic states and magnetically linked to said layer of superconducting material in at least one of said two states; and an electrical conductor in thermal contact with said layer of magnetic material, wherein said conductor is configured such that control of a current through said conductor is able to control said thermal switching of said magnetic layer.

Preferably a layer of spacer material is provided between the magnetic and superconducting materials, to provide thermal insulation (for example, in embodiments where a travelling temperature pulse is employed to generate a travelling magnetic wave) and/or electrical insulation (where an electrical conductor is employed to generate a travelling change in temperature, depending upon the conductivity of the magnetic material and the placement of the conductor). Additionally or alternatively the magnetic and superconducting materials may be physically separated or separatable, for example in different parts of a superconducting flux pump apparatus, and may be in separate containments. For example in embodiments of the flux pump the superconductor may be mounted on a holder such as a "wand" in such a way that it can be charged and/or discharged by fitting the superconductor against the magnetic material such that the two are sufficiently close for the flux pump to operate. Thus in embodiments the holder may be plugged into a magnetic charging and/or discharging unit which comprises the magnetic material such as a Prussian Blue analogue, preferably the associated electronics and preferably a magnet or coil to provide the magnetic field.

Thus in a further aspect the invention provides a two-part superconducting flux pump apparatus, the apparatus comprising a first part including a superconductor, and a second part comprising a charging and/or discharging unit for changing the magnetisation of the superconductor, the charging/discharging unit including at least a switchable magnetic material and system for switching the magnetic material, whereby the superconductor can be brought or is positioned adjacent the switchable magnetic material such that the magnetisation of the superconductor can be changed by controlling the switching of the magnetic material. The system for switching the magnetic material preferably comprises a system for thermally switching the magnetic material; a magnet or coil may also be included to generate a magnetic field.

Preferably the superconductor comprises a high temperature superconductor such as a so-called cuprate superconductor, preferably YBCO (yttrium barium copper oxide).

The invention also provides a superconducting device having a plurality of pixels each including a flux pump as described above. (The skilled person will understand that a reference to a superconducting device or flux pump is not limited to the device or flux pump when in its superconducting state.)

In embodiments once one pixel is magnetized the ambient magnetic field on an adjacent pixel is increased and hence the ambient field on the Prussian blue is greater and hence one pump on the second pixel produces a greater magnetisation than the pump on the first pixel. Thus a first magnetized superconductor may be used to assist in magnetizing a second superconductor, the second a third and so forth.

Therefore the invention also provides a method of magnetizing a superconductor of a series of physically adjacent superconductors, the method comprising magnetizing a first superconductor of said series such that flux of said first superconductor links a second superconductor of said series, and using said linked flux for magnetizing said second superconductor.

Similarly the invention provides a system for magnetizing a superconductor of a series of physically adjacent superconductors, the system comprising means for magnetizing a first superconductor of said series such that flux of said first superconductor links a second superconductor of said series; and means for using said linked flux to magnetize said second superconductor.

Such a device may be used to generate a pixilated magnetic field, in particular having a shape perpendicular to a plane of the device which is definable by defining the magnetisation of each pixel. This allows the generation of unusually shaped magnetic fields, such as a substantially flat magnetic field over a region of a plane.

Thus in a further aspect the invention provides a method of defining a magnetic field over an area, the method comprising: providing a plurality of superconducting magnetic elements; and controlling magnetizations of said superconducting magnetic elements to define said magnetic field over said area.

The skilled person will understand that the superconducting magnetic elements may all be part of the same superconductor—that is, the magnetizable layer and/or the superconductor may be one continuous layer, for example, patterned into pixels (this is illustrated in FIGS. 1b and 1c, described later). In still further embodiments the magnetizable (switchable magnetic) layer may comprise a continuous layer (for example as shown in FIG. 1b, described later). In some preferred embodiments a spacer or thermally insulating layer is provided between the magnetizable or switchable magnetic layer and the superconductor or a superconducting layer. However in embodiments the insulating layer may be omitted, for example if the switchable magnetic later is operating below the critical temperature of the superconductor, preferably well below this temperature (for example in the case of Prussian Blue or an analogue thereof and YBCO).

In a further related aspect the invention provides a superconducting magnetic device, the device comprising: a superconducting magnetic element comprising a region of superconductor and a system for applying a travelling magnetic wave to said region of superconductor Preferably the device includes a plurality of electrodes for addressing selected superconducting magnetic elements to drive a system to apply a travelling magnetic wave to magnetize (or de-magnetize) an addressed element. As mentioned above, preferably the device comprises a plurality of magnetic pixels. Each of these pixels may form a superconducting flux pump, in particular with a magnetizable layer patterned into pixels and a corresponding plurality of superconducting magnetic elements. In embodiments the magnetizable or switchable magnetic layer and/or the superconductor may be a continuous layer optionally, but not essentially, separated from the superconductor by a layer of insulating material. Preferably the system for applying a magnetic wave comprises a region of magnetizable material for magnetizing (or de-magnetizing) the superconductor. Preferably the system further comprises at least one electrical conductor for applying a travelling thermal wave to the magnetizable material to generate the travelling magnetic wave (changing magnetic field) by changing magnetic ordering in the magnetic material.

The invention further provides a magnetizable superconductor comprising a superconductor having a surface, a layer of magnetizable material over said surface, and a thermally insulating region between said superconductor surface and said magnetizable material.

The thermally insulating region may, in embodiments, comprise an air gap, for example to allow the magnetizable material and magnetized or de-magnetized superconductor to be separated from one another. The surface of the superconductor need not be planar.

Preferably the layer of magnetizable material comprises a material which spontaneously orders below a temperature not more than 100 Kelvin greater than a temperature above which superconductivity of the superconductor ceases in the absence of a (magnetic) field. For example the Curie temperature of a ferromagnetic or ferrimagnetic material is preferably relatively close to the temperature at which the superconductor becomes superconducting, for example at not more than 10 K, 50 K, or 100 K greater. However embodiments may still be operative with a larger temperature difference, for example 500 K or even 100 K depending upon the degree of thermal insulation. It will be appreciated that in some arrangements the thermally insulating region need only provide partial thermal isolation or may even be dispensed with.

In another aspect the invention provides a magnetized superconductor having a surface and an axis defined by a direction normal to said surface, the magnetized superconductor having, in the absence of an external applied magnetic field, a magnetic field which changes non-monotonically with increasing distance away from said axis.

In some preferred embodiments the surface of the superconductor is substantially planar; the axis may define the symmetry of the superconductor. The magnetisation techniques described herein enable a superconductor to be magnetized in novel ways.

Thus in a further aspect the invention provides a magnetized superconductor having a surface and an axis defined by a direction normal to said surface, the magnetized superconductor having, in the absence of an external applied magnetic field, a magnetic field which has at least a region in which the strength of the field is substantially constant with increasing distance from said axis.

In a conventional planar magnet shape de-magnetisation prevents the fabrication of a magnet with a substantially constant magnetic moment over its surface. Conventionally with a magnet of this shape the magnetic moment would fall towards the centre of the magnet. By contrast in embodiments of the technique we describe the magnetic moment of, for example, a superconducting disc increases substantially linearly towards the centre of the superconductor (disc). The circulating currents set up may be conceptually viewed as a set of concentric pancake coils. Where these virtual coils carry substantially the same current the field increases towards an axis of symmetry of the superconductor. Where the above mentioned travelling field is such that these currents are different a position intermediate between a field decreasing towards the axis of symmetry and a field increasing towards the axis of symmetry may be obtained, in particular a substantially flat field (that is a magnetic moment perpendicular to a flat surface which is substantially constant across at least a central part of the surface). There are many ways in which different circulating currents can be set up. One method is to use a conductor which tapers so that it narrows towards the axis of symmetry of the superconductor; another method is to use a pixilated magnetizable superconductor as described above to generate a magnetic field which is substantially constant over a region of a planar surface.

Thus in a further aspect the invention provides a magnetized superconductor, said magnetized superconductor having a plurality of substantially concentric circulating currents, said currents having the same sense of circulation and different relative magnitudes.

In embodiments of the magnetisation technique we describe, a central circulating current circulates in an opposite sense to the plurality of concentric circulating currents.

The techniques we describe enable very strong magnetic fields to be generated, for example, a magnetic field with a maximum magnetic moment of at least 1 T, 2.2 T, 2.3 T or more (the skilled person will understand that, for a superconductor, magnetic moment and magnetisation are synonymous). This is greater than obtainable using current materials.

Thus the invention further provides a magnetized superconductor having a substantially planar shape, and a magnetic moment of at least 1 T.

For example, using a typical high temperature superconductor with a critical current density ($J_c$) of $10^{10}$ A/m$^2$, to generate a field of 1.4 T would, in embodiments, require a 1 mm diameter disc of superconductor having a thickness of 90 μm. With a 5 mm diameter disk for the same field strength a thickness of approximately 45 μm is calculated to be sufficient. A superconductor of this type may be magnetized to 1.4 T using an excitation, repeatedly applied, of only in the region of 20 to 30 mT.

The fundamental principle we are using is to induce a changing magnetic field using heat. This produces an electric field which in turn leads to a current. In the embodiment as described we are inducing the current in a superconductor, the current then persists and leads to a persistent magnetic field. In fact the techniques described herein may be used with any electrical conductor (not just a superconductor). In aspects of embodiments of the invention the superconductor may be replaced by a conventional conductor so that, for example, an embodiment of a device then operates as a heat engine to produce electric power.

Thus the invention also provides a heat or light engine for producing electrical power from light or thermal energy, the engine comprising: means to convert a change in the light or temperature into a change in magnetic field; and means to convert said change in magnetic field into electrical power.

The inventor has recognised that a similar concept may be employed as the basis of a highly efficient solar cell.

Thus according to a further aspect of the invention there is provided a solar cell, the solar cell comprising: a first layer of material to provide a window with magnetically alterable light transmission; a second layer of magnetically switchable material beneath said first layer of material, said magnetically switchable material having a light-responsive magnetisation; and a conductor in a magnetic field of said magnetically suitable material; and wherein in operation transmission of light to said magnetically switchable material oscillates to cause changes in said magnetisation to induce a current in said conductor.

Preferably the first layer of material comprises a liquid crystal material. In embodiments the solar cell includes means such as a permanent magnet to generate a magnetic field for the switchable magnetic material.

These and other aspects of the invention will now be further described, by way of example only, with reference to the accompanying figures in which.

Figure 14:
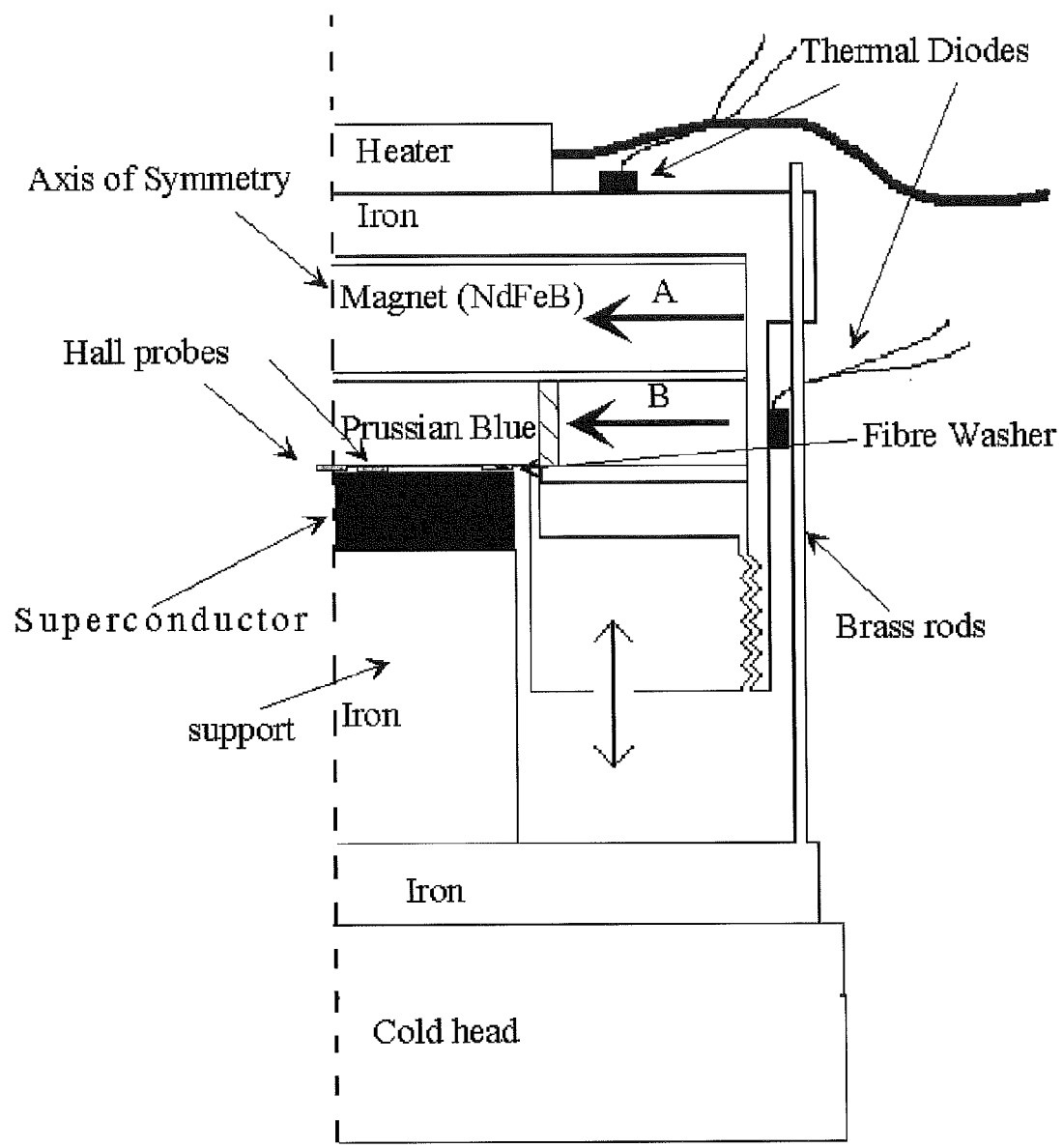
FIG. 14 shows experimental apparatus for demonstrating techniques embodying aspects of the invention.
Figure 18A:
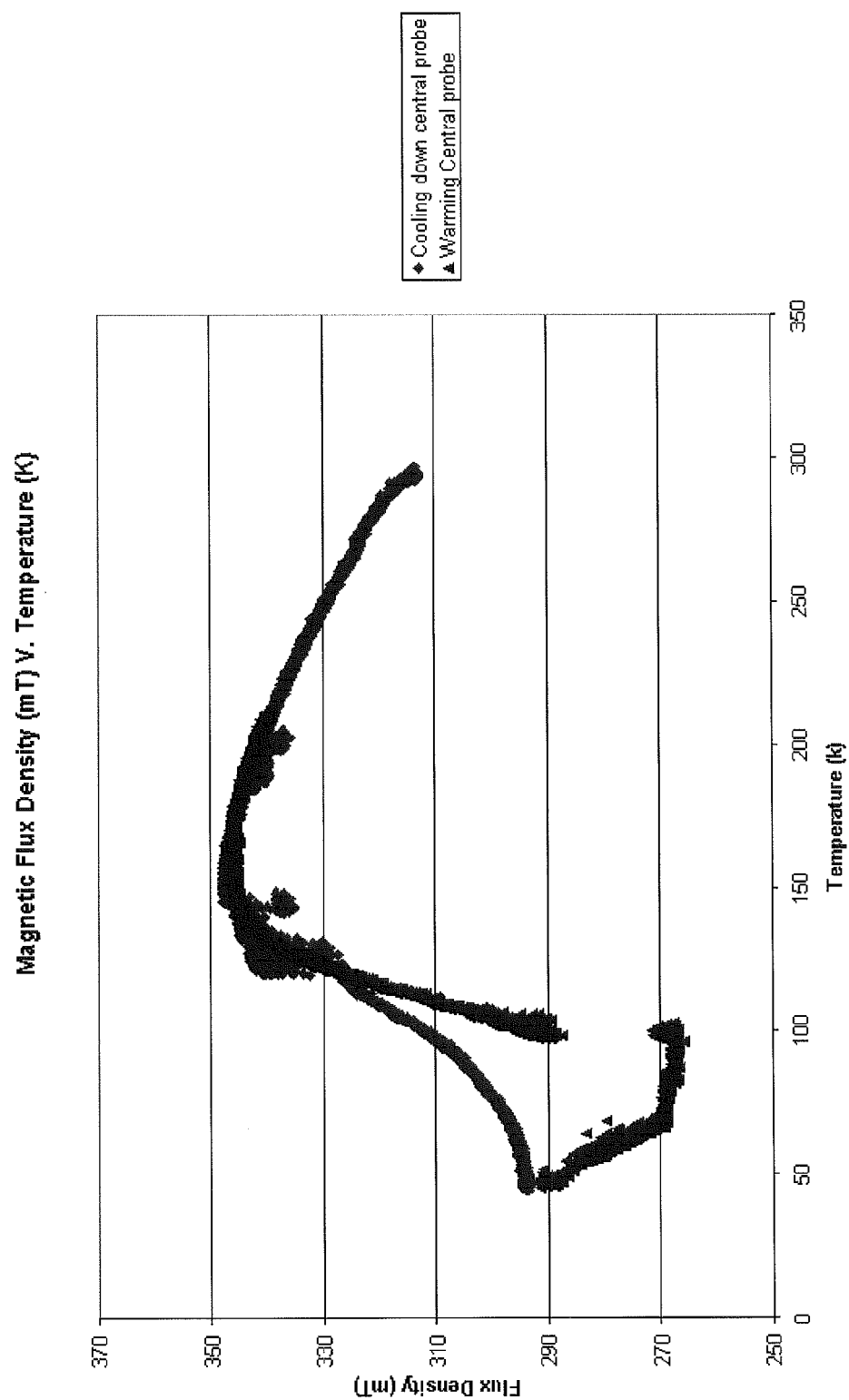
Figure 19:
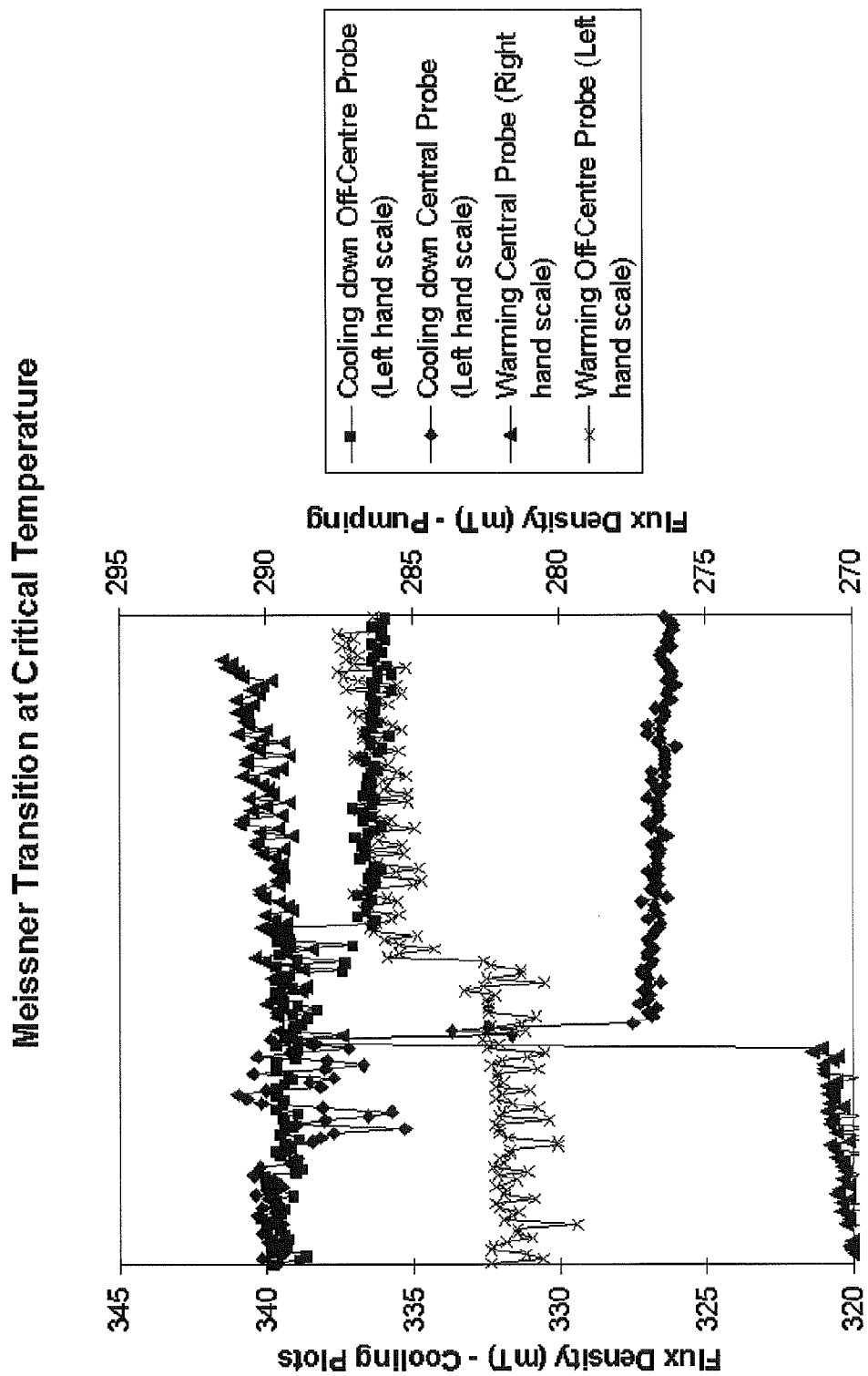
Figure 20:
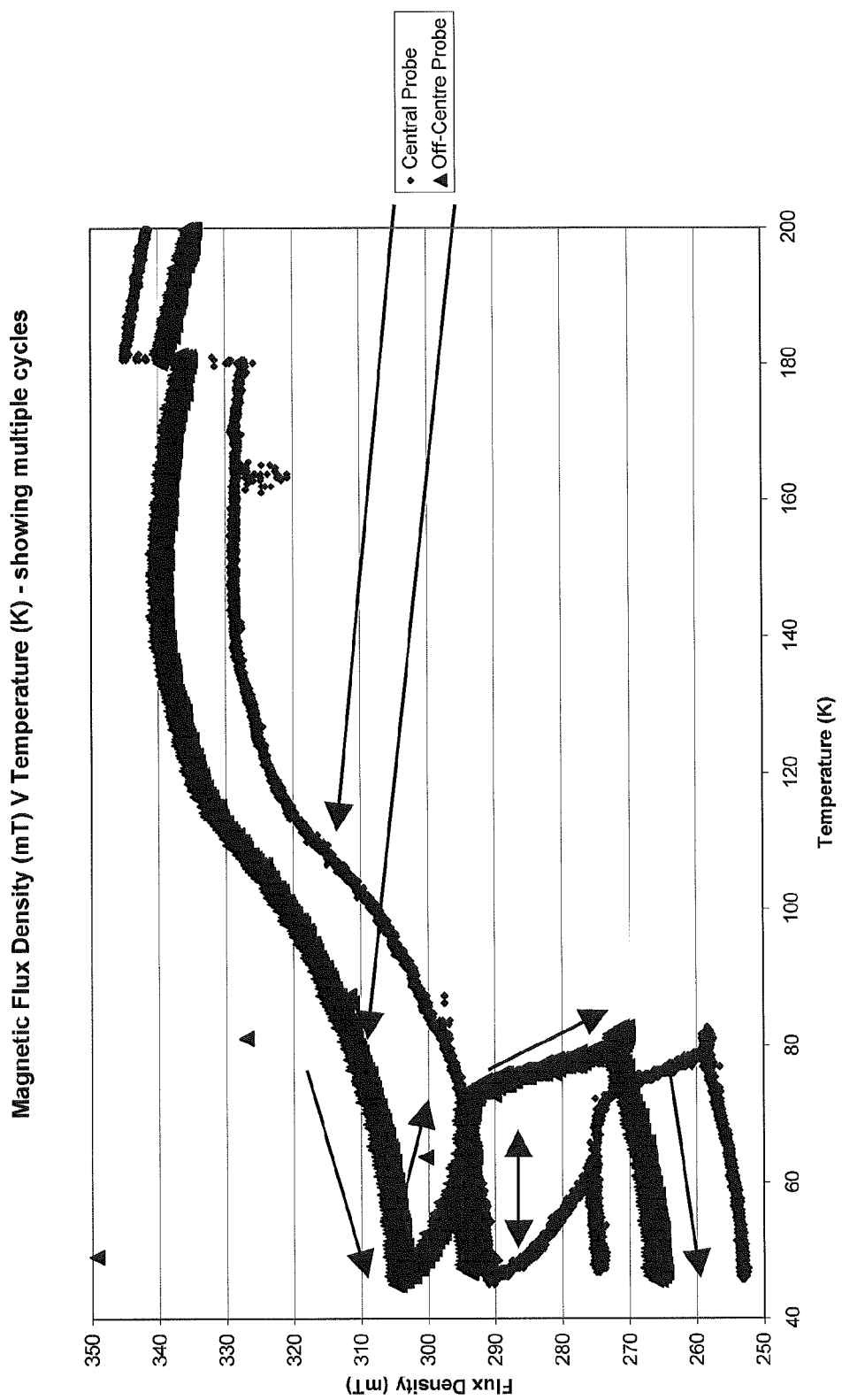
Figure 21:
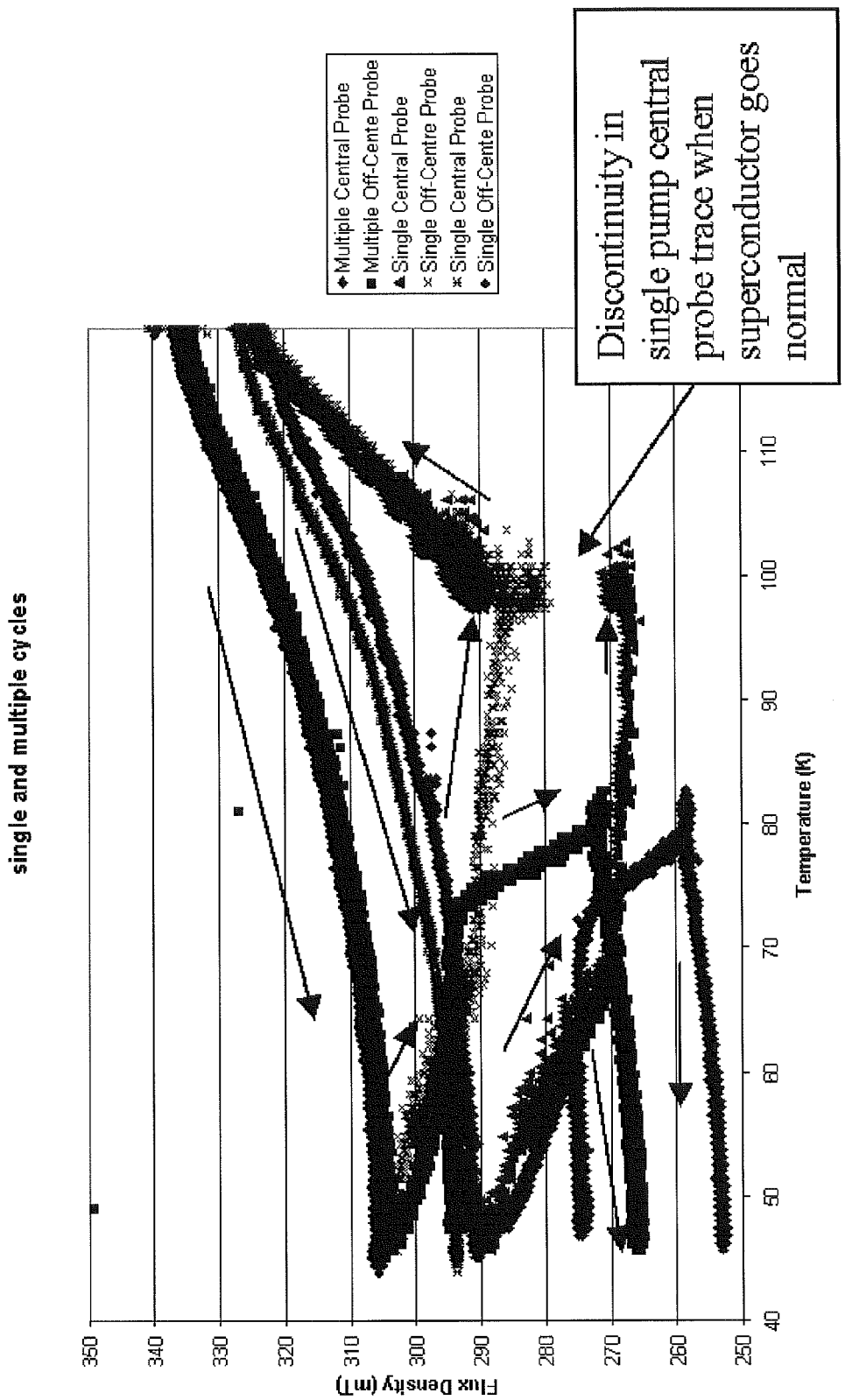
Figure 22A:
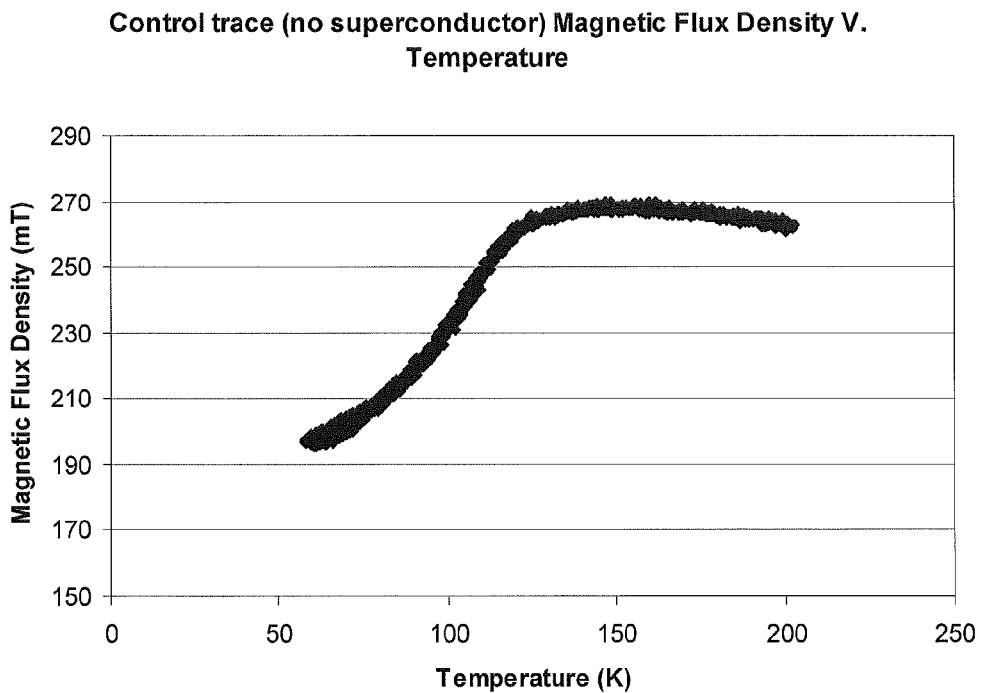

FIGS. 18a and b show, respectively, graphs of magnetic flux density (mT) against temperature (K) for central and off-centre probes for the apparatus of FIG. 14, illustrating cooling and warming;

FIG. 19 shows the Meissner transition at the critical temperature for cooling (left-hand scale) and warming (right-hand scale) or central and off-centre probes;

FIG. 20 shows a graph of magnetic flux density (mT) against temperature (K) showing multiple pump cycles for central and off-centre probes;

FIG. 21 shows a graph of magnetic flux density (mT) against temperature (K) for both single and multiple pump cycles, illustrating for the single central probe a discontinuity in the trace when the superconductor goes normal; and FIGS. 22a and b show control traces with no superconductor.

Figure 1A:
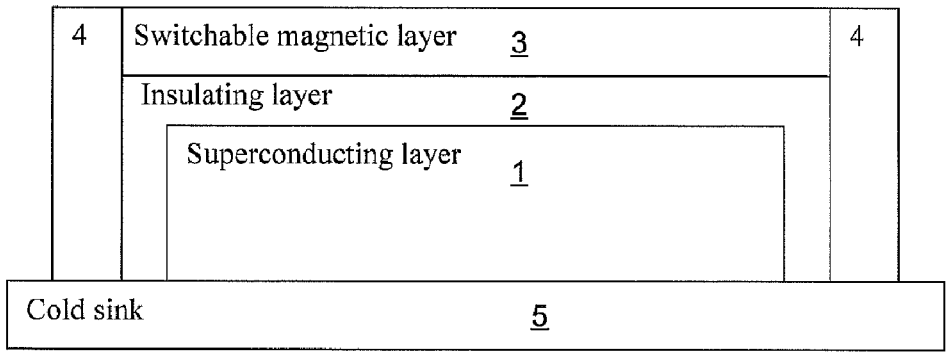
FIG. 1 shows superconducting flux pump elevations.
Figure 1B:
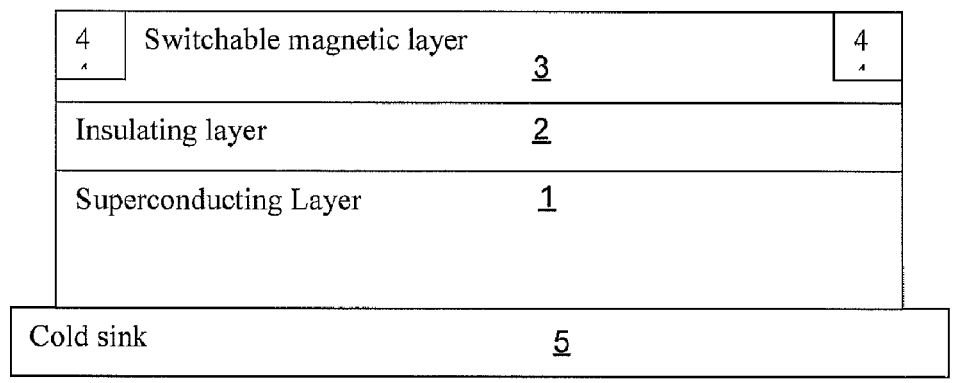
Figure 1C:
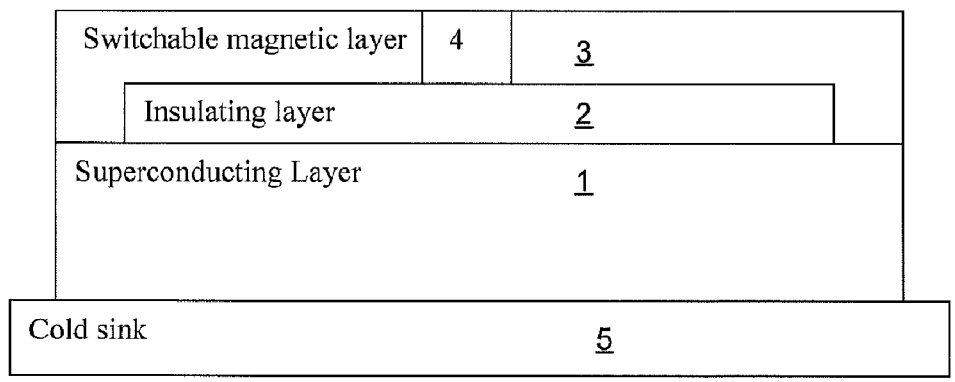
Figure 2:
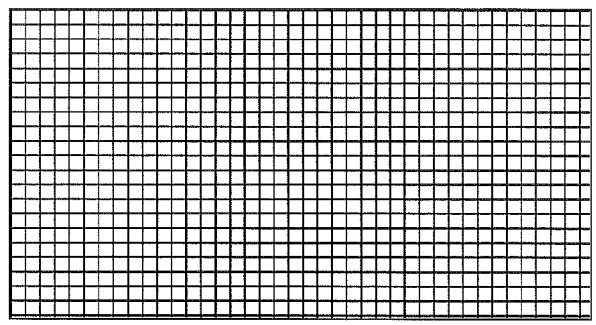
FIG. 2 shows Flux pump from above showing multiple flux pump cells each, for example, of a type as shown in FIG. 1.

Referring to FIG. 1, this shows Superconducting Flux pump elevations, and FIG. 2 shows a Flux pump from above showing multiple flux pump cells each, for example, of a type as shown in FIG. 1.

In some preferred embodiments the elements which make up the system are as follows:
1) superconducting layer
2) insulating layer
3) switchable magnetic layer
4) source of heat/conducting layer The geometry is shown schematically in FIGS. 1 and 2. FIG. 1 shows the elevation of one of the elements; FIG. 2 a group of elements from above. Both FIG. 1 and FIG. 2 are provided to illustrate the principle. They are not intended to be a precise representation of the final device. There are a number of different variations which could be used for providing a source of heat with which to drive the superconductor normal for rapid de-magnetisation. Or for ease of fabrication having a continuous superconducting layer as shown in FIG. 1b and/or a continuous insulating layer such as that shown in FIG. 1c.

Referring in more detail to FIG. 1, in all of FIGS. 1a to 1c a superconducting layer 1 is in (direct) thermal contact with a cold sink 5. A thermally insulating layer 2 is provided over the superconducting layer 1, in FIG. 1a entirely covering the superconducting layer and making contact with the cold sink, in FIG. 1b covering the upper surface of the superconducting layer, and in FIG. 1c partially covering the upper surface of the superconducting layer. In each of the three illustrated embodiments the insulating layer 2 separates most or all of the switchable magnetic layer from the superconducting layer beneath (in FIG. 1c the switchable magnetic layer 3 partially contacts the superconducting layer, in particular at an edge). The fourth layer 4 which may comprise a source of heat and/or electrical or thermal conductor is preferably in direct contact with the switchable magnetic layer 3, and is optionally also in direct contact with the insulating layer 2 (FIG. 1c) and may be in contact with the cold sink 5 (FIG. 1a). The structures shown in FIGS. 1a to 1c may be replicated over an area and thus one or more of the superconducting layer, the insulating layer and the switchable magnetic layer may comprise a continuous layer. In variants of the illustrated examples the layer (wires) 4 may lie on top of the switchable magnetic layer rather than being inset into the layer as shown in FIG. 1b. In still further embodiments the insulating layer may be omitted, for example if the switchable magnetic layer (for example Prussian Blue or an analogue thereof) is operating at a temperature below, preferably substantially below, the critical temperature of the superconducting layer, for example YBCO.

In FIG. 2 the grid of conductors/source of heat is shown uniform. In practice and in particular if a fixed field pattern is required then this may not be the case. For example a uniform field pattern can be produced either by switching different elements a different number of times or by making the elements have different dimensions. FIG. 2 shows a pixel map in which all of the pixels are substantially the same size but the skilled person will appreciate that the pixels (within one device) may be of differing sizes.

Continuing to refer to preferred implementations of a flux pump, the superconducting layer is kept cold from below and is isolated thermally from the top layer by the insulating layer. The cold head and the switchable magnetic layer are coupled thermally. Typically Layer 4 would be a wire (or wires) down which current would be passed in order to regulate the temperature of the top (magnetic) layer. Using this arrangement it is possible to send a thermal pulse along the switchable magnetic layer switching it either from magnetic to non-magnetic or visa versa and thus creating a magnetic wave which passes across the superconductor. As it passes across the superconductor flux will be trapped in the superconductor and the total flux trapped will depend on the number of times a pulse has been sent. Any number of cells may be used (depending on the application) and the device will be wired so that different cells may be pumped different numbers of time. Thus enabling the correct patterns of field to be generated. The flux may be either pumped up to greater magnitudes or pumped down. Once the field pattern is established it is stable as long as the temperature of the superconductor is maintained.

Figure 3:
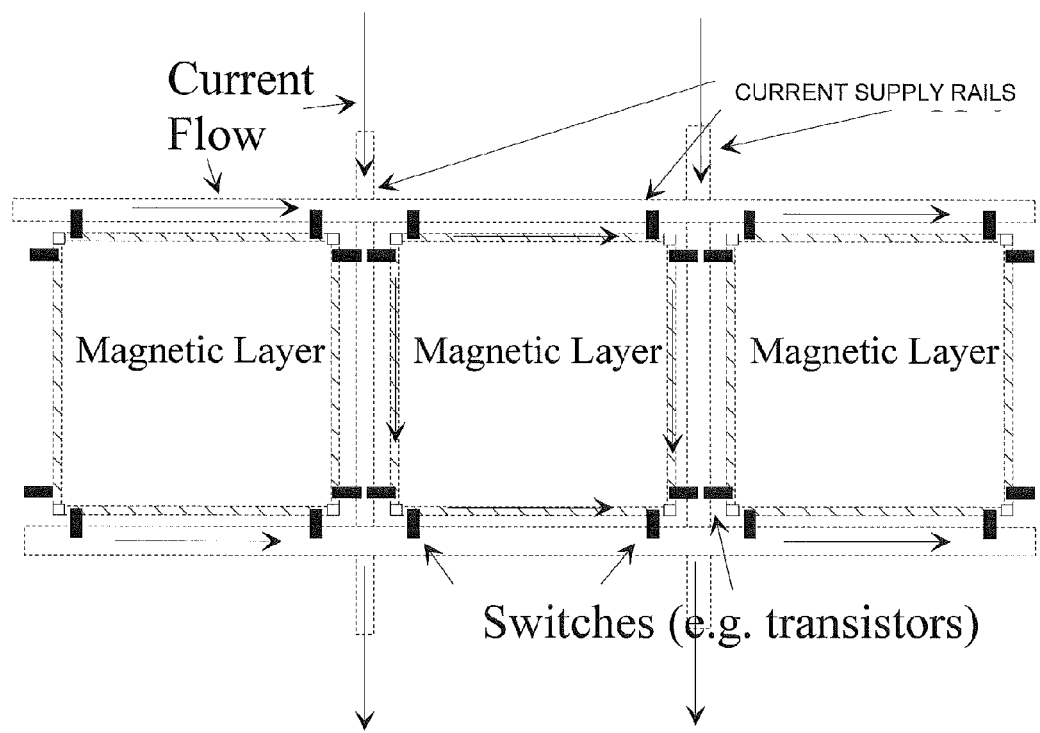
FIG. 3 shows a view from above of a device as shown in FIG. 1, with example addressing for a flux pump cell for the device of FIG. 2.

FIG. 3 shows a view from above of a device as shown in FIG. 1, with example addressing for a flux pump cell for the device of FIG. 2, illustrating three unit cells. In the diagram current is shown being diverted to the centre cell in order to create a heated region along the edges of the Magnetic layer. The switches, which would typically be transistors, allow current from the supply rails to be diverted to or from the conductors which are shown hatched in the diagram and which lie adjacent to the magnetic layer.

Magnetic Materials

Currently materials tested for the switchable magnetic layers are Prussian blue analogues. In general these undergo ferro- and ferri-magnetic ordering at temperatures similar to the critical temperature of YBCO. A range of these materials is shown in the table below (from Molecular Magnetism from Molecular Assemblies to the Devices, Ed. Eugenio Coronado et al). Examples of materials which have been used to date are: $Ni_{1.5}^{II}[Cr^{III}(CN)_6]$; and $C_8H_2ONNi^{II}[Cr^{III}(CN)_6]$; more detail of experimental work is given later. However, the skilled person will appreciate that in principle just about any magnetic material may be employed for the switchable magnetic layer. The technique may also be applied with materials which go diamagnetic. All that is required is that a changing magnetic field is induced adjacent to the superconductor.

The compound $CsNi^{II}[Cr^{III}(CN)_6] \cdot 2H_2O$ is useful because $T_c$ for YBCO is 93 K; the compound $Cu^{II}_3[Cr^{III}(CN)_6]_2 \cdot 15H_2O$ is useful because its $T_c$ (66 K) is near the freezing temperature of nitrogen (64 K).

Prussian Blue Analogues; F and FI stand for ferro- and ferrimagnetic ordering, respectively:

| Compound | $T_c$/K | ordering |
|---|---|---|
| $(NBt_4)_{0.5}Mn^{II}_{1.25}[V^{II}(CN)_5] \cdot 2H_2O$ | 230 | FI |
| $Cs_2Mn^{II}[V^{II}(CN)_6]$ | 125 | FI |
| $Cr^{II}_3[Cr^{III}(CN)_6]_2 \cdot 10H_2O$ | 240 | FI |
| $V^{II}_{0.4}V^{III}_{0.6}[Cr^{III}(CN)_6]_{0.86} \cdot 3H_2O$ | 310 | FI |
| $Cs_{0.75}Cr^{II}_{1.125}[Cr^{III}(CN)_6] \cdot 5H_2O$ | 190 | FI |
| $CsMn^{II}[Cr^{III}(CN)_6] \cdot H_2O$ | 90 | FI |
| $CsNi^{II}[Cr^{III}(CN)_6] \cdot 2H_2O$ | 90 | F |
| $Mn^{II}_3[Cr^{III}(CN)_6]_2 \cdot 15H_2O$ | 66 | FI |
| $Ni^{II}_3[Cr^{III}(CN)_6]_2 \cdot 15H_2O$ | 53 | F |
| $Cu^{II}_3[Cr^{III}(CN)_6]_2 \cdot 15H_2O$ | 66 | F |
| $(NMe_4)Mn^{II}[Cr^{III}(CN)_6] \cdot 4H_2O$ | 59 | FI |
| $K_2Mn^{II}[Mn^{II}(CN)_6]$ | 41 | FI |
| $CsNi^{II}[Mn^{III}(CN)_6] \cdot H_2O$ | 42 | F |
| $Ni^{II}_3[Mn^{III}(CN)_6] \cdot 12H_2O$ | 30 | F |
| $CsMn^{II}[Mn^{III}(CN)_6] \cdot \frac{1}{2}H_2O$ | 31 | FI |
| $Mn^{II}_3[Mn^{III}(CN)_6]_2 11H_2O$ | 37 | FI |
| $(NMe_4)Mn^{II}[Mn^{III}(CN)_6] \cdot 8H_2O$ | 29 | FI |
| $Mn_2[Mn^{IV}(CN)_6] \cdot xH_2O$ | 49 | FI |
| $Fe^{III}_4[Fe^{II}(CN)_6]_3 \cdot xH_2O$ | 5.6 | F |
| $Co^{II}_3[Fe^{III}(CN)_6]_2 \cdot 14H_2O$ | 14 | FI |
| $Ni^{II}_3[Fe^{III}(CN)_6]_2 \cdot 14H_2O$ | 23 | F |
| $Cu^{II}_3[Fe^{III}(CN)_6]_2 \cdot 12H_2O$ | 14 | FI |
| $Mn^{II}_3[Fe^{III}(CN)_6]_2 \cdot 15H_2O$ | 9 | FI |

Superconductors

The preferred superconductors are cuprates e.g. YBCO; this is made in thin film, thick film and bulk materials and has a reasonably high $T_C$ (critical temperature) and can trap high fields, but in principle any Type II superconductor may be employed. In addition there are variations on YBCO where the Yttrium is replaced by other rare earths such as Gadolinium or Rubidium (these are generally referred to as ReBCO). Other candidates are BSCCO either in 2212 or 2223 forms, magnesium diboride (MgB2) which has the virtue of being very cheap but has a low $T_C$ (in the middle 30's Kelvin). There are a whole host of other materials which could be used, for example the lanthanides or the compounds based on mercury or thallium.

There is also a large number of materials that can be described as organic superconductors. These include the Bechgaard salts Fabre salts which are both quasi one-dimensional, and quasi two-dimensional materials such as Kappa-$BEDT$-$TTF_2X$, lambda-$BETS_2X$ and graphite intercalation compounds and three-dimensional materials such as the alkali-doped fullerenes.

A list of candidate cuprates can be found in "Superconducting materials—a topical overview", Hott, Roland; Kleiner, Reinhold; Wolf, Thomas et al. (2004-08-10) oai: arXiv.org:cond-mat/0408212. They include high temperature superconductor families: Bi-HTS ($Bi$-$m^2(n-1)n$, BSCCO); T1-HTS ($T1$-$m^2(n-1)n$, TBCCO); Hg-HTS ($Hg$-$m^2(n-1)n$, HBCCO); Au-HTS ($Au$-$m^2(n-1)n$); 123-HTS (RE-123, RBCO); Cu-HTS ($Cu$-$m^2(n-1)n$); Ru-HTS (Ru-1212); B-HTS ($B$-$m^2(n-1)n$); 214-HTS (LSCO"0202"); (Electron-Doped HTS PCCO NCCO); ("02(n-1)n"); Infinite-Layer HTS (Electron-Doped I.L.).

As a proof of principle we created a model in which field is being swept in from the outside of a ring of superconductor to the inside of a superconductor by the mechanism described above. The geometry used in the model is for ease of calculation. The device will work just as well in the square geometry described above (or any other geometry).

The parameters used in the model are 3.5 mm thickness of superconductor with a $J_c$ of 1e10 A/m$^2$. Magnet thickness 2 mm and providing 20-30 mT perpendicular to the surface of the superconductor.

Figure 4:
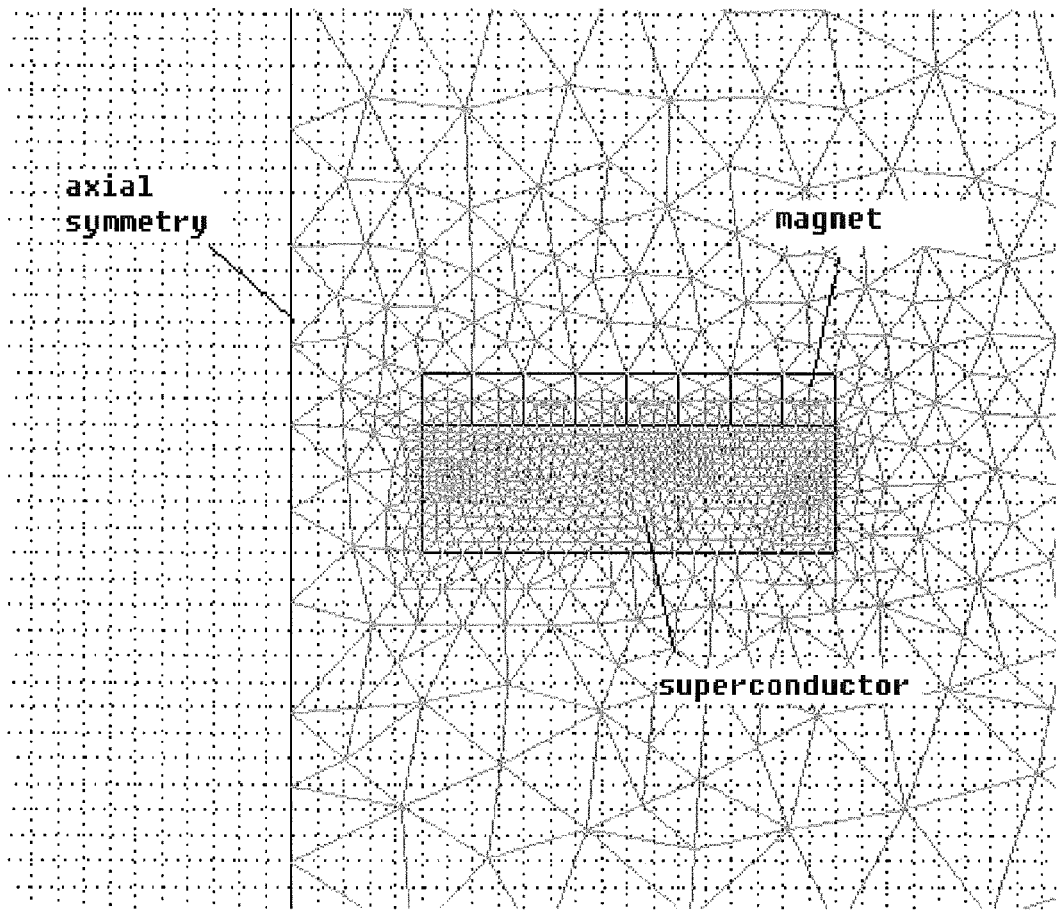
FIG. 4 shows an example model geometry.
Figure 5:
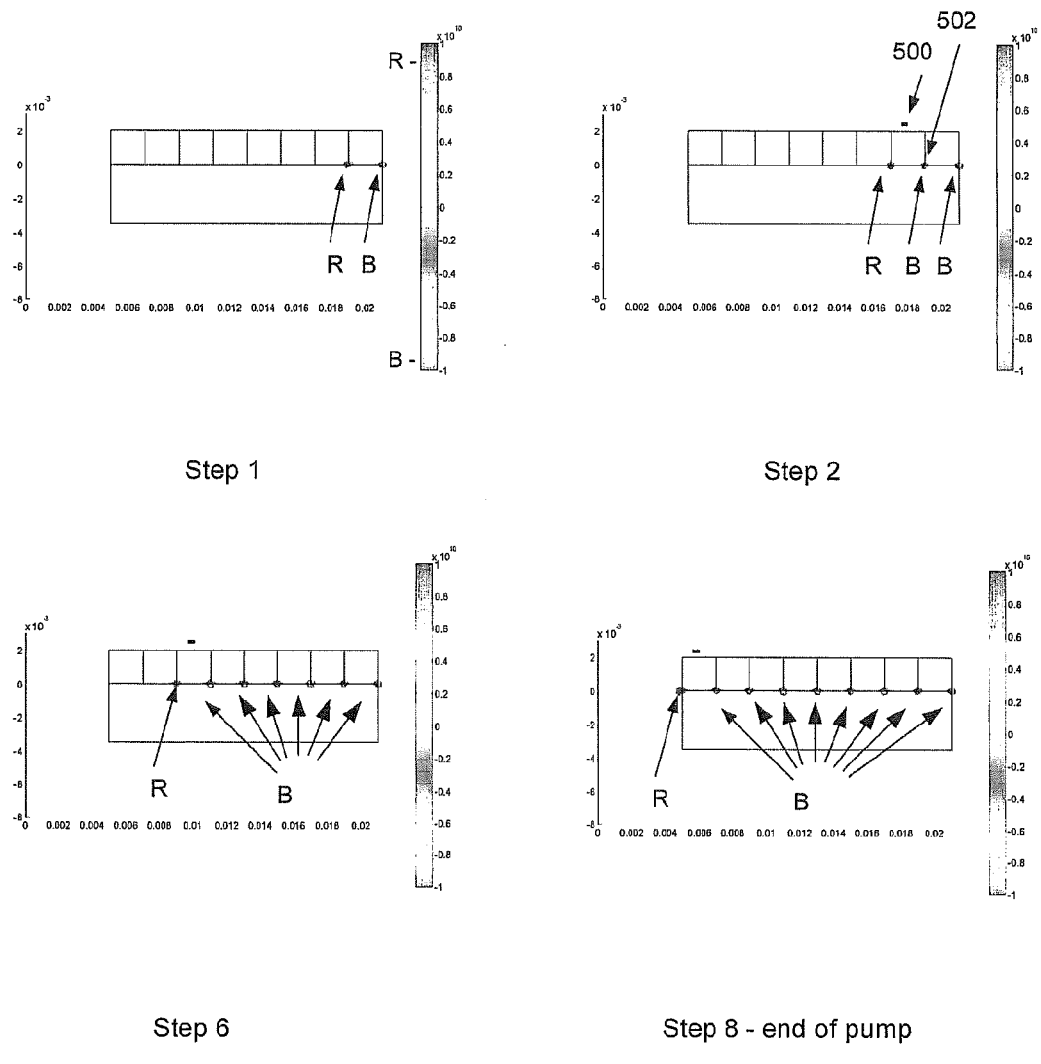
FIGS. 5 to 7 show in a series of steps what happens when a field is swept in to the centre of a superconductor (only the righthand half of the superconductor, which is bilaterally symmetric, is shown)
Figure 6:
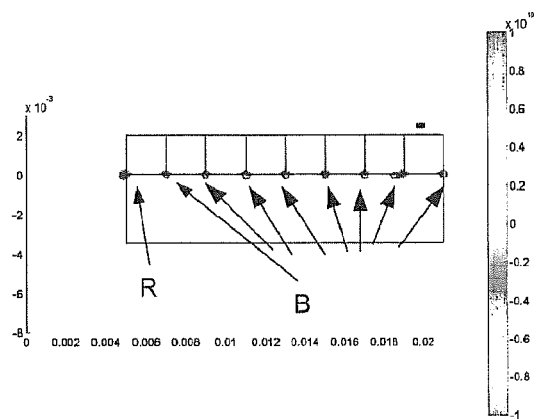
Figure 6:
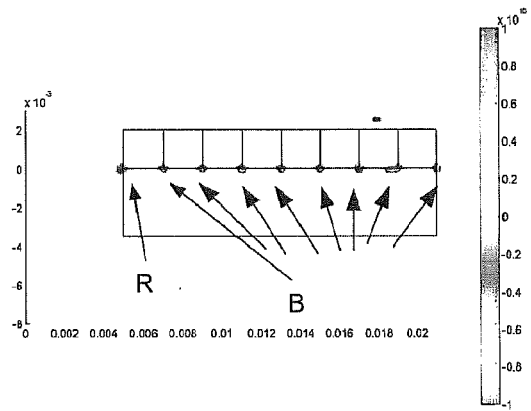
Figure 6:
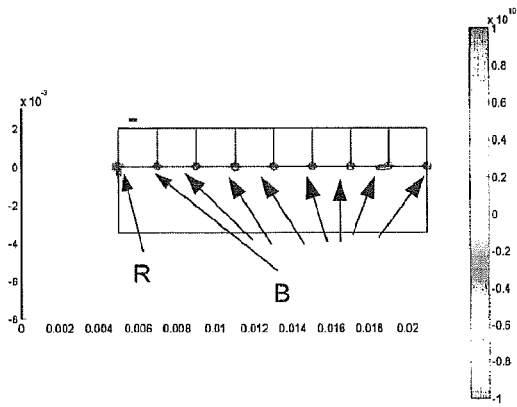
Figure 7:
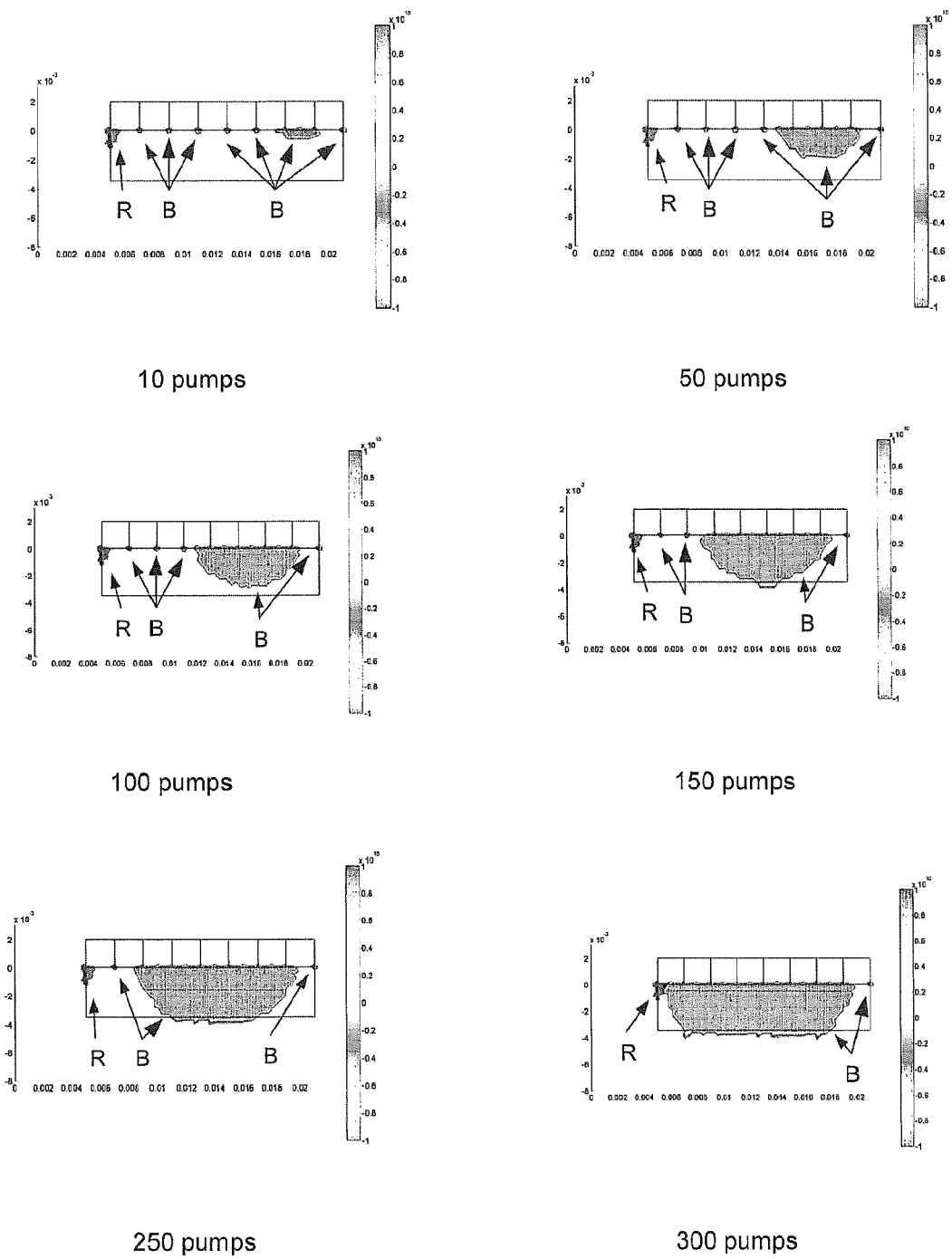

FIG. 4 shows an example Model Geometry. FIG. 5 shows in a series of steps is what happens when a field is swept in to the centre of a superconductor (only the right hand half of the superconductor, which is bilaterally symmetric, is shown). In this example, the field is assumed to be generated by a small magnet travelling right to left; at each step the position of the magnet is immediately below the marker 500. (At position 502 in step 2 the field from step 1 and the field from the new magnet position do not cancel because not all the flux induced in step 1 is trapped by the superconductor.) Two pumps are shown step by step for illustration (FIG. 6) and then the state after 10, 50, 150, 250 and 300 pumps (FIG. 7). In each of the diagrams the blue area (B) is current travelling into the page the red area (R) is current travelling out of the page. As the number of cycles is increased the blue area gets larger and larger and the physical limit of the trapped field is reached when the superconductor is entirely full of current. This is dependent on the $J_c$ (the critical current density) and the volume of superconductor.

Figure 8:
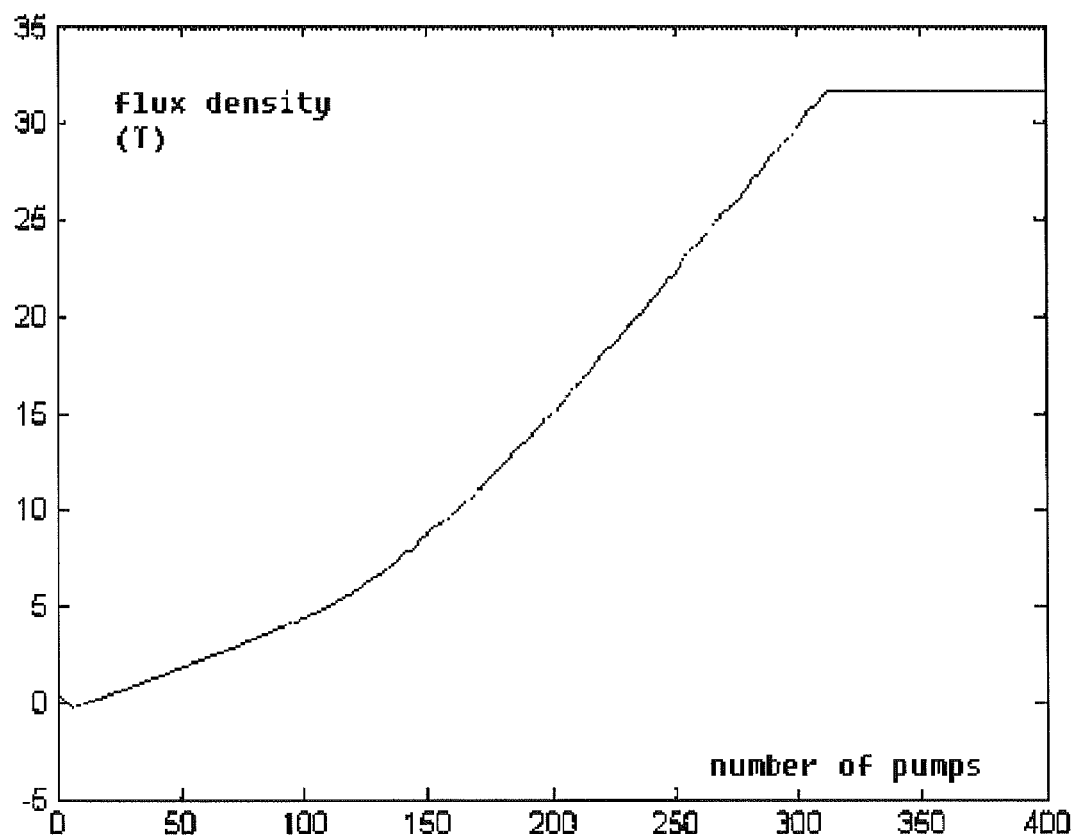
FIG. 8 shows trapped flux density in the central of SC ring (average B against No. of pumps)

The graph of FIG. 8 shows how the magnetic field develops with the number of pumps. Thus FIG. 8 shows trapped flux density in the central of SC ring (average B against No. of pumps).

Figure 9A:
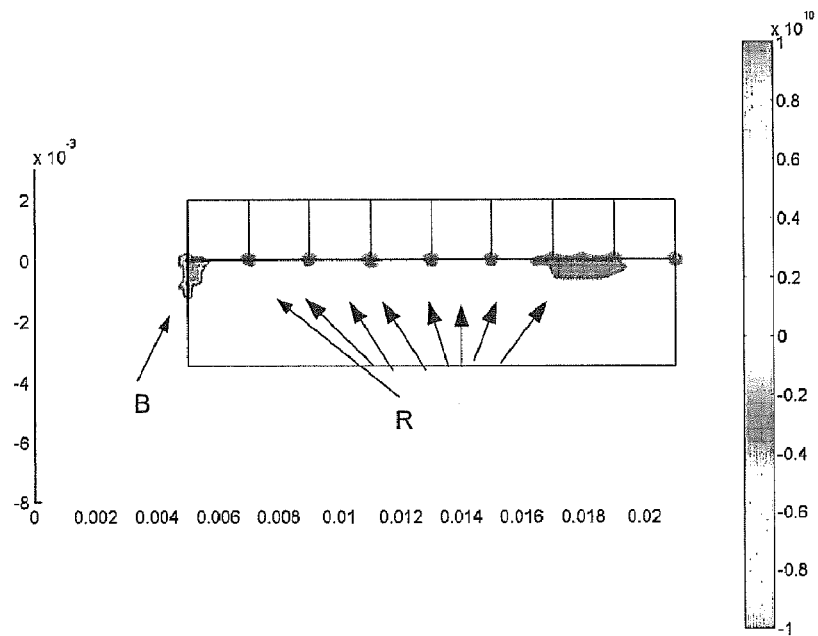
FIG. 9 shows a demagnetization process similar but complementary to that of FIG. 7.
Figure 9A:
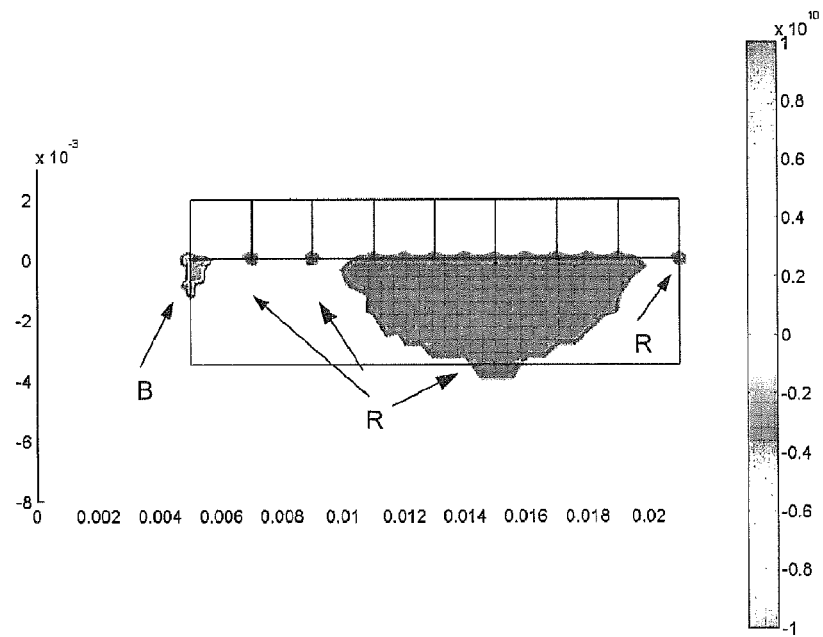
Figure 9B:
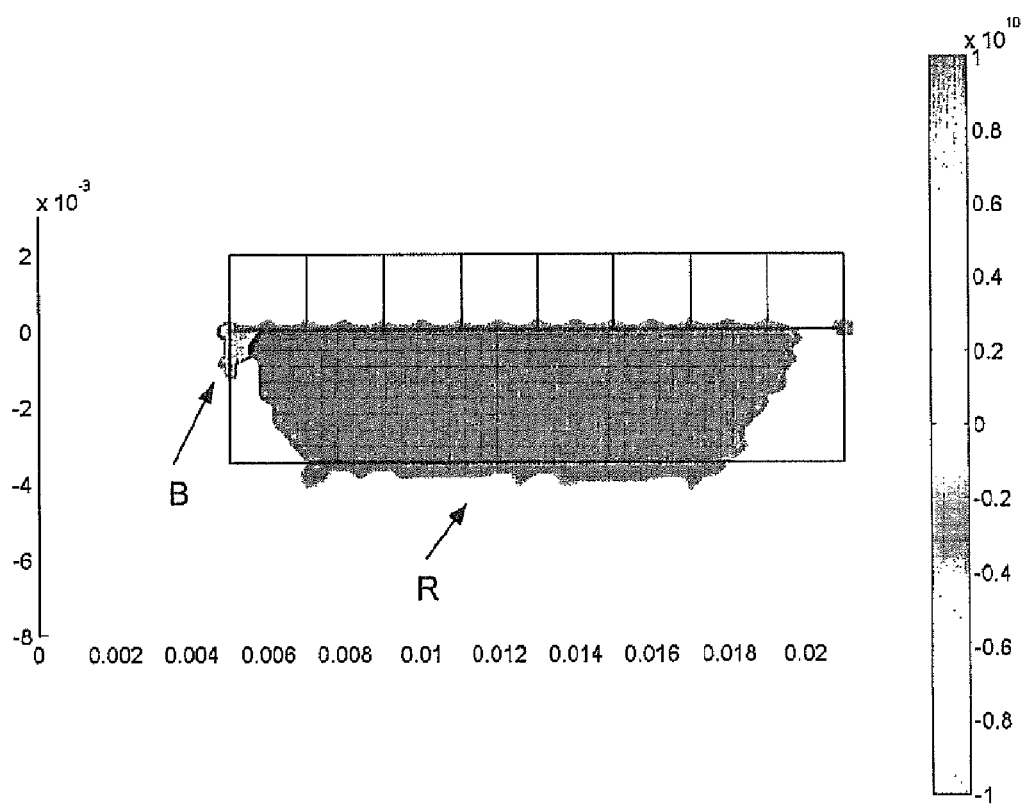
Figure 10:
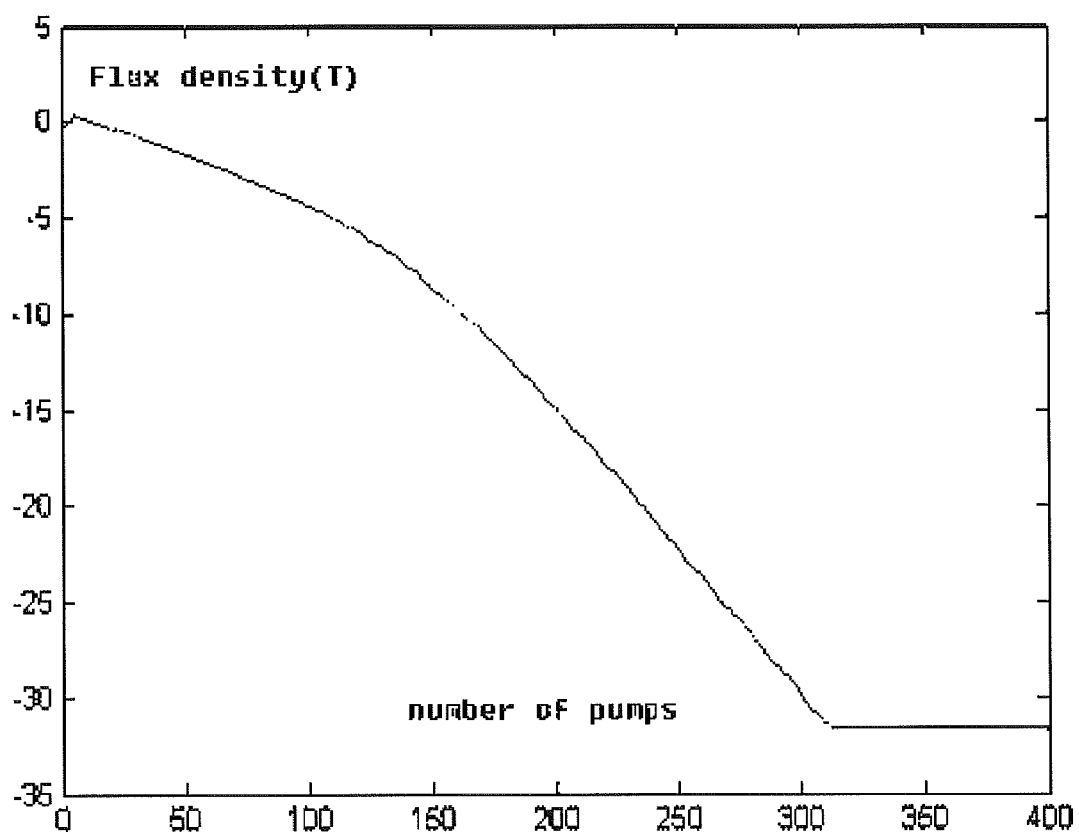
FIG. 10 shows the trapped flux density in the central of SC ring (average B against No. of pumps) for a demagnetization process.

The system works just as well with the magnet being switched off as well as on—it simply has the opposite effect. This is illustrated in FIG. 9 which shows a demagnetization process similar but complementary to that of FIG. 7. FIG. 10 shows the trapped flux density in the central of SC ring (average B against No. of pumps) for a demagnetization process.

Figure 11:
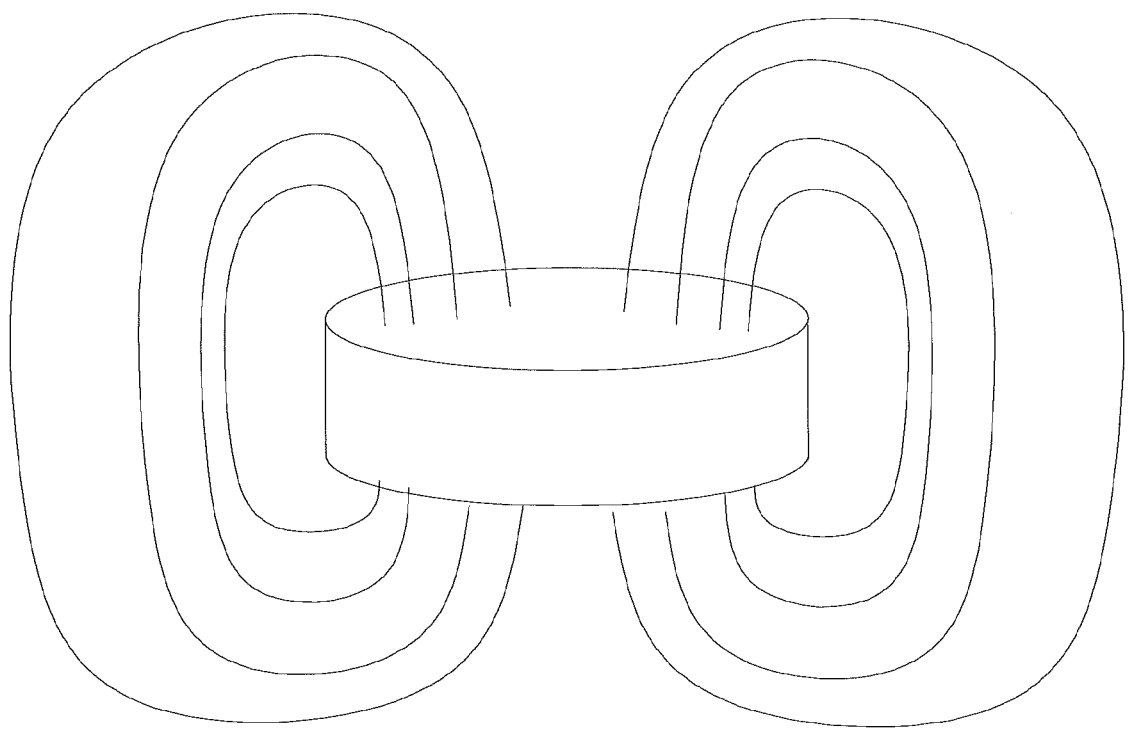
FIG. 11 shows an example magnetized superconductor.

FIG. 11 shows a schematic representation of magnetic flux in a cylindrical section of superconductor. The spacing of the flux lines indicates the local magnetic flux density. Equally spaced flux lines equates to constant flux density.

Figure 12A:
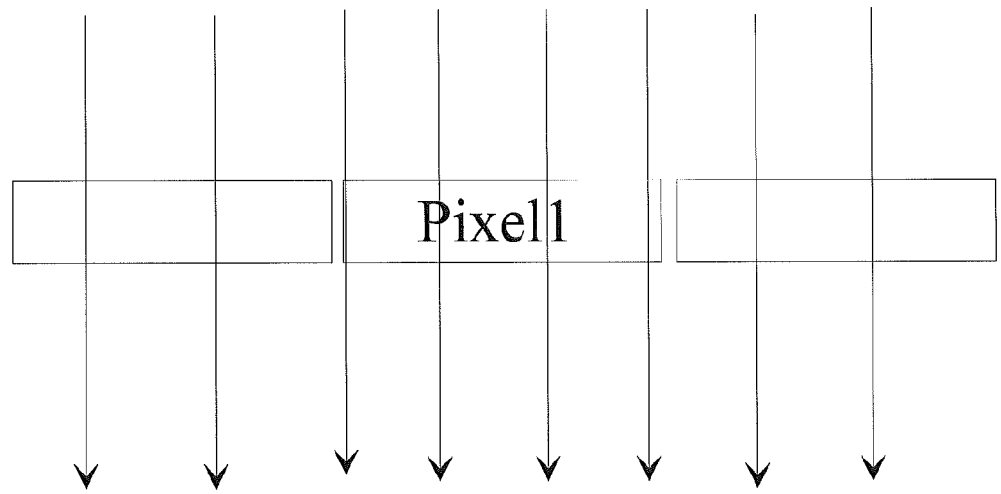
FIG. 12 illustrates a flux multiplying effect.
Figure 12B:
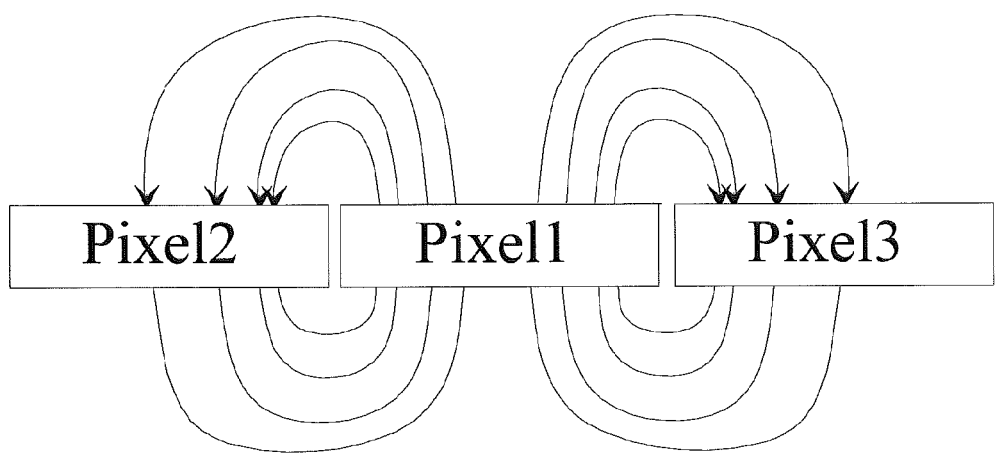

Referring to FIG. 12, this illustrates a flux multiplying effect. In FIG. 12a, a weak ambient applied field used to magnetize pixel 1 (arrows represent direction of magnetic field; spacing of arrows represent magnetic flux density). In FIG. 12b adjacent pixels now have ambient applied field plus that from pixel 1 hence pumping on pixel 2 now produces a greater resultant field than the first pump on pixels 1.

In more detail, for example, suppose that pixel 1 is magnetized to 300 mT, say by repeated application of a 30 mT field. Pixels 2 and 3 each share 150 mT and therefore the effective field on these pixels is 180 mT (150 mT+30 mT) and in this way the field magnetizing successive pixels in a series of pixels or superconductors may be multiplied to greatly increase the magnetizing field (in the example given to 1800 mT at the next stage and then 18 T). At some point the magnetizable material (Prussian blue) will saturate but it will be appreciated that very high fields may quickly be obtained using this type of technique.

The above description shows the basic operation of the flux pump and presents a model showing the principle. The implementation is shown for illustration purposes at the device's simplest level and it should be noted that in principle there may be more magnetic layers in which the magnets are being switched either on in sequence in order to improve the pumping speed or for that matter in which different layers have different critical temperatures so that one layer increases the trapped field in the superconductor while another reduces it.

There are in fact two ideas incorporated here. The first is using a material which undergoes a transition between non-magnetic and magnetic (be they ferro, ferri or dia) states to sweep magnetic field across a "receptacle" for magnetic field (which would typically be a superconductor). This process could be done any number of times (including once) and may be used to either raise or lower the resultant magnetic field.

The second idea is the principle of "pixellating" magnetic field to enable patterns of field to be set up. The purpose of "pixellating" the magnetic field here is to enable the density and the strength of the magnetic field to be varied locally. This is important for many reasons but may be understood once it is realised that, for example, if a uniform field distribution is required, this would not be produced by having all the pixels equally magnetized or equally distributed over the plane.

This is idea is significant for many reasons, which include:
1) The geometry is unique (it is not generally possible to produce high magnetic fields parallel to a minor axis i.e. perpendicular to the plane)
2) There is currently no practical way of trapping a high magnetic field in a section of superconductor without applying at least an equally higher one; this method uses fields of low flux density applied many times
3) Quantising the magnetic field in space and magnitude means that many field patterns can be produced both static and dynamic and in embodiments the absence of coils means the limits imposed by inductance need not apply.

Figure 13:
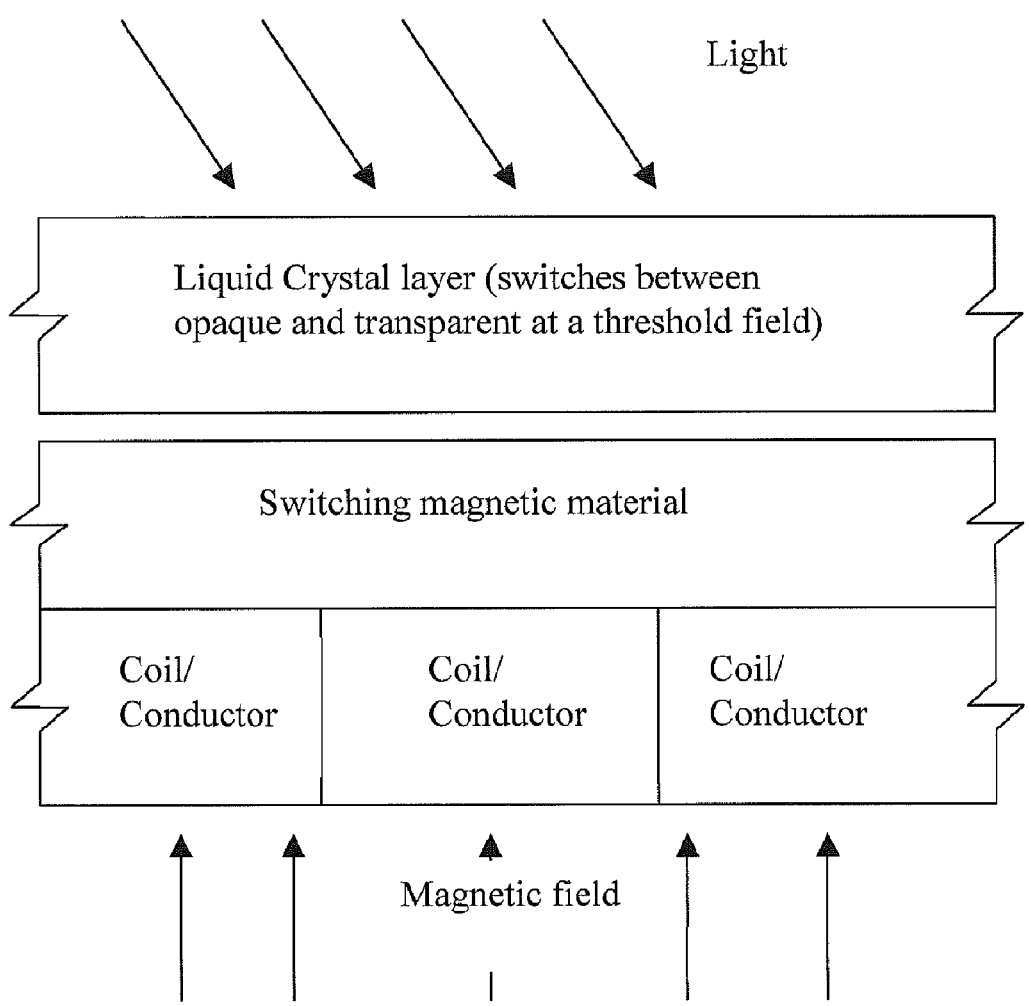
FIG. 13 shows an example solar cell.

The concepts we have described above can also be adapted to construct a heat engine, as previously mentioned, and also an efficient solar cell. One example of such a device is shown in FIG. 13 and has three layers, a first layer comprising a liquid crystal material which switches in the presence of a magnetic field between a first state, preferably substantially transparent and a second state, preferably substantially opaque. An example of a suitable liquid crystal material is 4-n-pentyl-4'-cyanobiphenyl, also referred to as 5CB. A second layer of the device, under the first layer (in a direction in which light impinges on the solar cell) comprises a layer of a magnetic material which is switched by light, for example 1,3,5-trithia-2,4,6-triazapentalenyl (TTTA) or some other compound which demonstrates a photo induced magnetisation effect or LIESST. The device also includes a third layer comprising an electrical conductor. In operation light shines through the liquid crystal in its transparent state, switching the magnetic state of the magnetic layer (Prussian Blue) causing a change in magnetic field. This induces an electric field in the conductor and consequently a current; the magnetic field also causes the liquid crystal layer to go opaque. Since the switchable magnetic layer is now in the dark it switches state again, causing another change in magnetic field and another current. The liquid crystal clears again and the cycle re-starts.

Referring in more detail to FIG. 13, this shows an example solar cell in which an external magnetic field is provided by a permanent magnet, and including one or more coil/conductors beneath the switching magnetic material in the case where (as many do) the switching magnetic material operates at a very low temperature.

There are many candidate liquid crystal materials, as mentioned above, one example being 4-n-pentyl-4'-cyanobiphenyl (5 CB) in which a transition occurs at about 400 gauss or 0.04 Tesla. This transition is from opaque to clear or from totally black to totally transparent in polarised light (see "Magnetic-field-induced Fréedericksz transition and the dynamic response of nematic liquid-crystal films with a free surface" Shyu-Mou Chen and Ting-Chiang Hsieh, Phys. Rev. A43, 2848-2857 (1991), [Issue 6-15 Mar. 1991]).

There are some magnetic materials which photoshift at or near room temperature. One example which has a $T_C$ of 296 K and switches between diamagnetic and paramagnetic is 1,3,5-trithia-2,4,6-triazapentalenyl (TTTA) (H. Matsuzaki, W. Fujita, K. Awaga and H. Okamoto, "Photoinduced phase transition in an organic radical crystal with room-temperature optical and magnetic bistability", PHYSICAL REVIEW LETTERS 91 (1): Art. No. 017403 Jul. 4, 2003).

There are also many Prussian Blue analogues which respond to light at cryogenic temperatures which could be employed in an embodiment of a flux pump according to the invention. The first of these were discovered by Hashimoto's group and were based on cobalt iron; for example: K0.2Co1.4 [Fe(CN)(6)]. 6.9H(2)O; and K0.4Co1.3[Fe(CN)(6)]. 5H(2)O (see Sato O, Iyoda T. Fujishima A, et al. "Photoinduced magnetisation of a cobalt-iron cyanide" SCIENCE 272 (5262): 704-705 May 3, 1996; and Sato O, Einaga Y, Iyoda T. et al. "Reversible photoinduced magnetization" JOURNAL OF THE ELECTROCHEMICAL SOCIETY 144 (1): L11-L13 JAN 1997). Another example based on Molybdenum is $Cu^{II}2[Mo^{IV}(CN8].8H20$ (S. Ohkoshi et al., *Chem. Lett.*, 4, 312 (2001); *J. Am. Chem. Soc.*, 128, 270 (2006); T. Hozumi et al., *J. Am. Chem. Soc.*, 127, 3684 (2005)—although in some applications this compound may not provide sufficient field. Another example is $Rb_{0.91}Mn_{1.05}[Fe(CN)_6].0.6H_2O$ ("Temperature- and photo-induced phase transition in rubidium manganese hexacyanoferrate", Shin-ichi Ohkoshi, Hiroko Tokoro and Kazuhito Hashimoto JOURNAL OF MATERIALS CHEMISTRY 15 (32): 3291-3295 2005). A still further example is the manganese compound Mn[tetracyanoethanide]2 as reported on by Epstein in "New Bases for Flexible, Light-weight, Low-cost, and Scalable Electronics Organic-based Magnetism and Doped Conducting Polymers for Field Effect Devices" Arthur J. Epstein.

Further compounds (not photoshifting) which may be employed in embodiments of the invention which undergo magnetic ordering or disordering and which are not Prussian Blue analogues are: Oxalates, for example tris-dithiooxalato salts, $A[M^{II}Cr(C_2S_2O_2)_3]$, with $A^+=PPh_4^+$, $N(n-C_nH_{2n+1})_4^+$, with n=3-5, where $M^{II}$ is Mn, Fe, Co, and Ni. (*Inorg. Chem.*, 42 (4), 986-996, 2003. 10.1021/ic020302x S0020-1669(02) 00302-6) and metal oxalate magnets such as $(R_4N)[Mn^{II}Cr^{III}(C_2O_4)_3]$. Dicyanamide compounds such as $M^{II}[N(CN)_2]_2$ and $M^{II}[N(CN)_2]_2L_x$ (L=pyridine, pyrazine, 2,2'-bipyridine, 4,4'-bipyridine). (Manson, J. L.; Incarvito, C. D.; Rheingold, A. L.; Miller, J. S. *J. Chem. Soc., Dalton Trans.* 1998, 3705); the trithiatriazapentalenyl radical, $C_2S_3N_3$ (McManus G D, Rawson J M, Feeder N, et al. "Synthesis, crystal structures, electronic structure and magnetic behaviour of the trithiatriazapentalenyl radical", C2S3N3 JOURNAL OF MATERIALS CHEMISTRY 11 (8): 1992-2003 2001); and V $(TCNE)_2.0.5CH_2Cl_2$ (MANRIQUEZ J M, YEE G T, MCLEAN R S, et al. A ROOM-TEMPERATURE MOLECULAR ORGANIC BASED MAGNET SCIENCE 252 (5011): 1415-1417 Jun. 7, 1991).

Still further all magnetic materials have a Curie point and potentially this could be reduced by doping to an appropriate temperature.

Experimental Results

Referring to FIG. 14, this shows a vertical cross section through one half of an experimental test rig (the other half corresponds) which was designed so that the behaviour of each item could be tested both in isolation and in combination. The assembly is modular and enables measurements to be taken with and without the Prussian Blue, with and without the superconductor and with the Hall probes either adjacent to the superconductor or adjacent to the magnet. Note that the arrangement of FIG. 14 is not to scale.

In the Figure the arrows labelled A and B indicate the thermal path for the magnet and the Prussian Blue. There is an additional thermal path between the superconductor and the Prussian Blue which is provided by a fibre washer. The rig is in a vacuum chamber and there are gaps above and below the Prussian Blue and the magnet. Two versions of the apparatus were constructed, one in brass to provide good thermal conductivity, the other in iron to provide a magnetic path. FIG. 14 shows the iron version; the results shown in FIGS. 18 and 19 later were obtained using the iron version of the rig. The Prussian Blue analogue on which the bulk of the experimental work was performed was $N_{1.5}^{II}[Cr^{III}(CN)_6]$, which has a very low relative permeability (approximately 3) and with this material it was found necessary to use the iron version of the apparatus to generate the illustrated experimental results. Measurements were also made on a second Prussian Blue analogue $C_8H_2ONNi^{II}[Cr^{III}(CN)_6]$, and SQUID measurements on this material supported the later described measurements demonstrating practical operation in an example system.

As previously mentioned, the magnetizable material (in this case Prussian Blue) need not itself generate a substantial magnetic field and may simply concentrate a separately applied field. Thus, for example in the embodiments of FIG. 1 a magnet or a further magnetic layer may be provided above the switchable magnetic layer 3. The apparatus of FIG. 14 shows an arrangement in which a magnetic field is provided by a NdFeB magnet, the field of which is enhanced by the Prussian Blue analogue.

Figure 15:
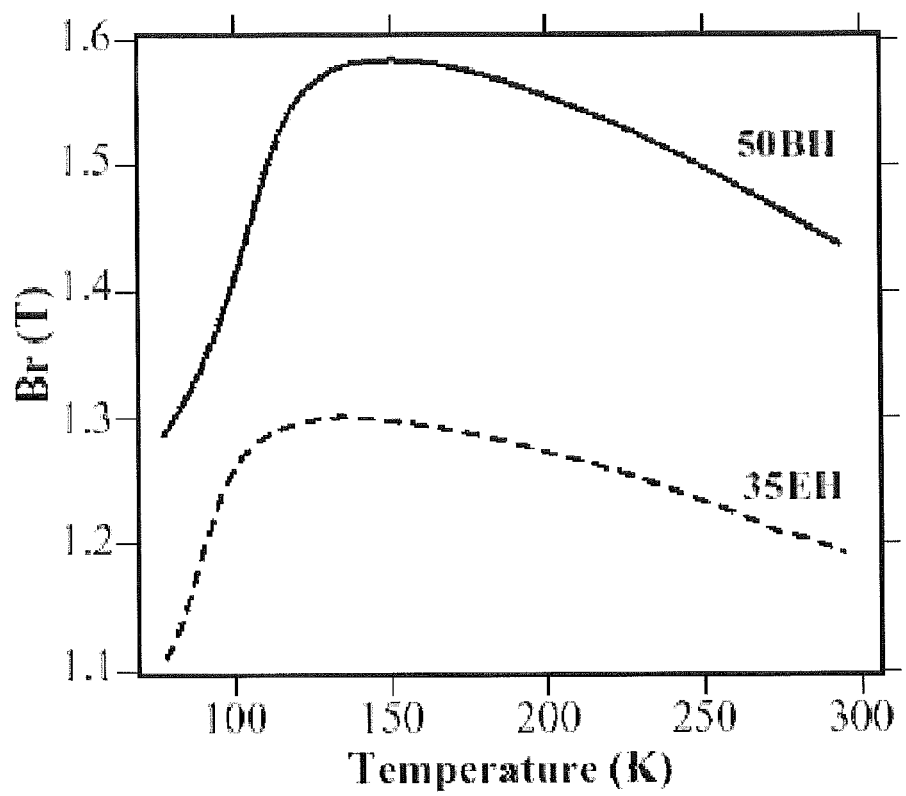
FIG. 15 shows example B—H curves for NdFeB.

Referring to FIG. 15 this shows example magnetisation (B—H) curves for different grades of NdFeB. From these curves it can be seen that the change in field is entirely reversible; the variation in magnetisation with temperature was measured using the rig of FIG. 14 and it was found that there was no net reduction in magnetisation when the magnet was returned to room temperature. Thus thermal cycling of NdFeB can achieve the desired change in magnetic field which will magnetize the superconductor. Referring to FIG. 15 it can be seen that NdFeB itself goes through a magnetic transition at about the correct temperature for YBCO and is therefore itself a candidate for the "switching" magnetic material.

Figure 16:
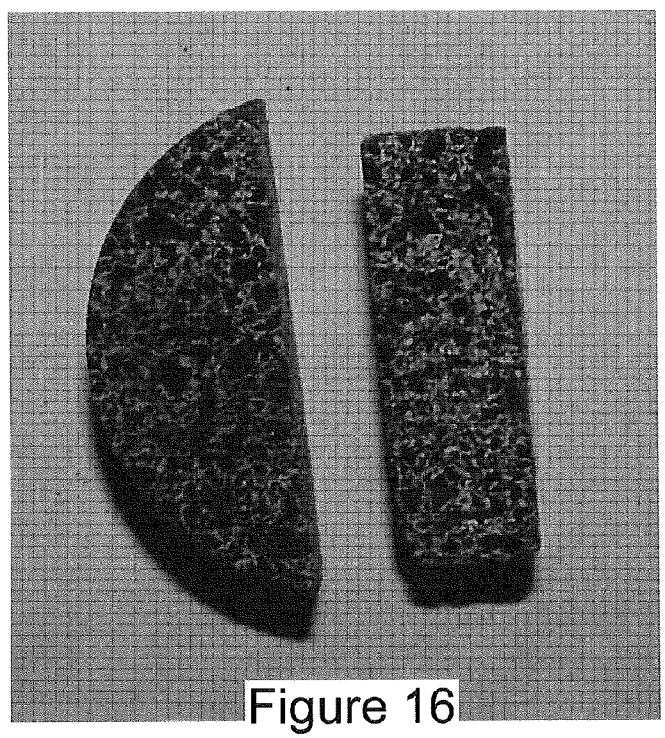
FIG. 16 shows top and cross-sectional views of an example Prussian Blue puck cut in half.

Prussian Blue analogues precipitate out from solution in powder form and tend to have poor thermal conductivity. One practical method of forming bulk structures is to use a metallic binder such as silver Dag™ which also increases the thermal and electrical conductivity while not adversely affecting the packing factor and therefore the overall magnetic moment. FIG. 16 shows an example of a Prussian Blue puck formed in this way.

Figure 17:
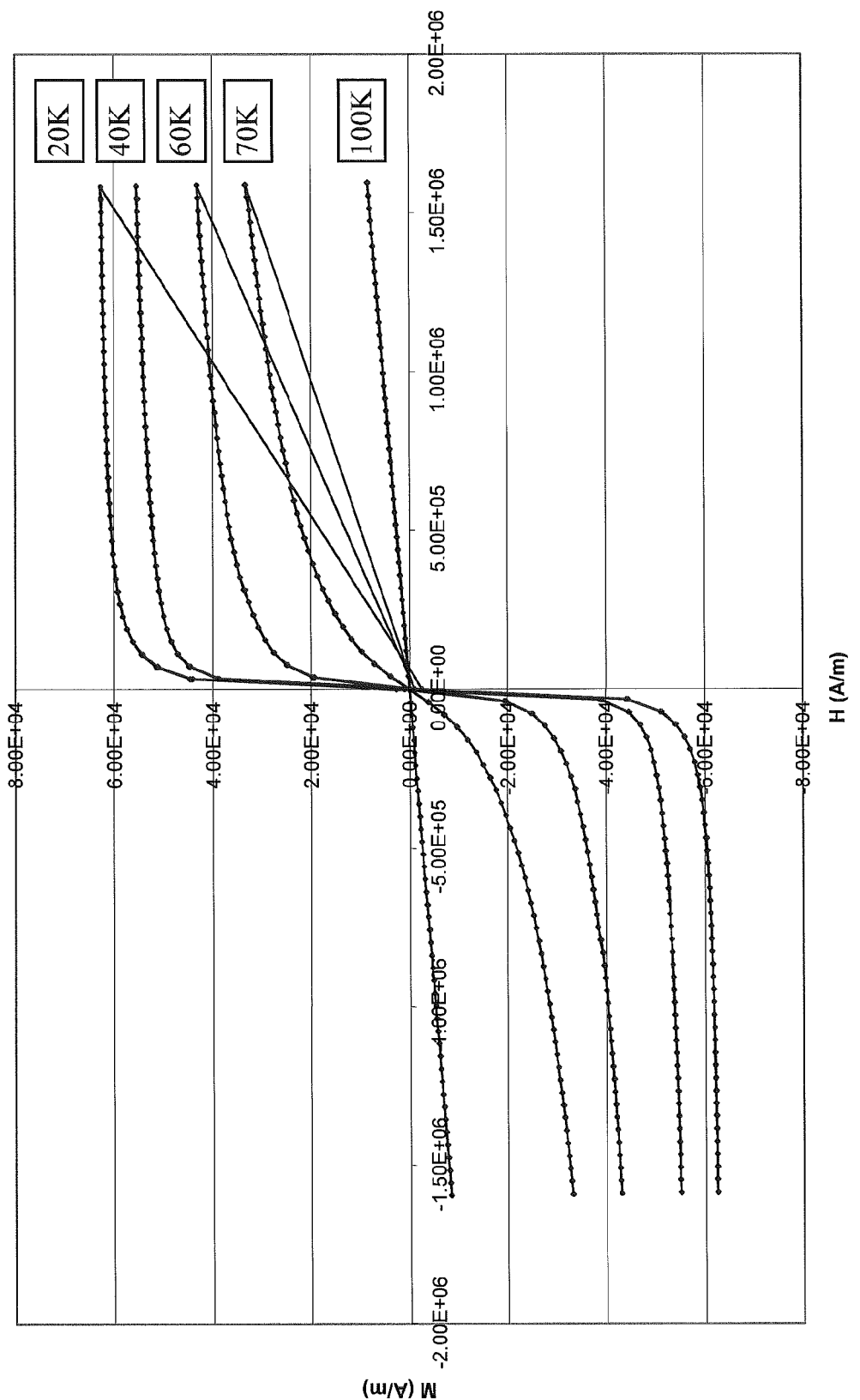
FIG. 17 shows M-H loops for a Prussian Blue analogue at different temperatures.
Figure 18B:
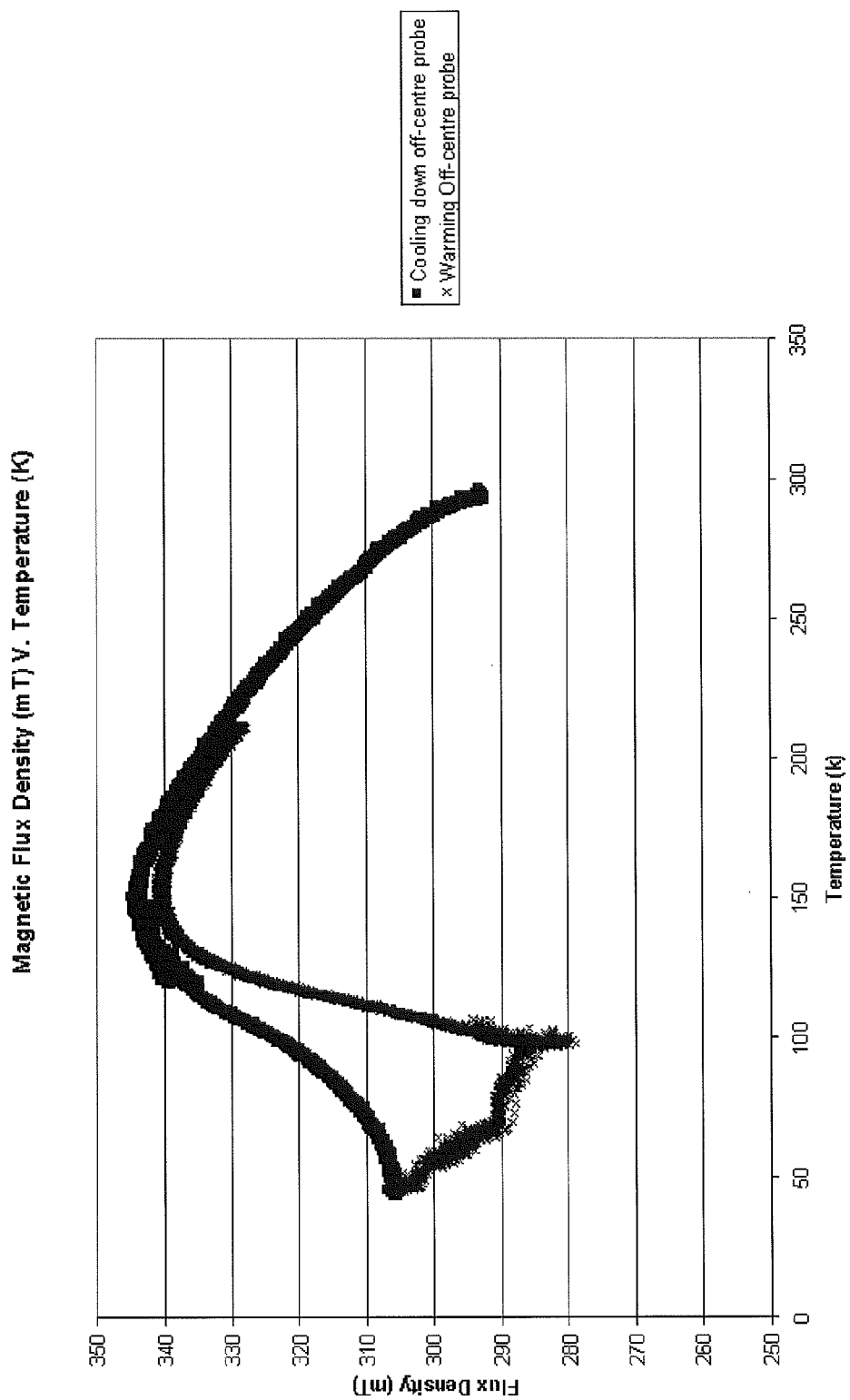

FIG. 17 shows M-H lops for a Prussian Blue analogue, $N_{1.5}^{II}[Cr^{III}(CN)_6]$ at different temperatures. When the applied field (X-axis) is constant reducing the temperature has the effect of increasing the total field. The analogue has an effective relative permeability of only three and a saturation magnetisation of about 60 mT at 40 K. At an applied field of $2.5*10^5$ Amps/m (0.3 T) changing the temperature between 45 K and 70 K produces a change in magnetisation of approximately $3*10^4$ Amps/m (38 mT). Modelling showed that this was sufficient to produce a travelling magnetic wave of the order of 20-30 mT amplitude in our test rig so this was used. However the skilled person will recognise that better compositions may be identified by routine experiment. FIGS. 18a and 18b show loops showing change in magnetic field due to thermal cycling. Two Hall probes were used one close to the centre line of the rig (FIG. 18a) and the other offset from the centre-line. In both cases the upper curve shows cooling down; the lower, warming.

FIGS. 18 and 19 show a single pump; FIG. 20 shows a double pump, and FIG. 21 shows the data in FIGS. 18 and 19 on a single figure.

It can be seen from FIG. 18 that as the rig is warmed the flux density reduces showing that the superconductor has been magnetized. Note in this plot warming was done by switching the compressor supplying the cold head off so that it is likely that the thermal path is through the fibre washer shown in FIG. 14.

Care should be used when interpreting FIG. 18. Since the temperature is only measured at a single position on the system and since that point is deliberately only weakly coupled thermally to the superconductor there will be a temperature difference between the measurement and that of the superconductor. This is evident in the Meissner transition which occurs at the point at which the superconductor reaches its critical temperature. When cooling down this occurs when the measured temperature (the body temperature) is recorded as being approximately 122 K. On the warming trace the transition occurs at about 98 K.

Notwithstanding the above there are two features which provide solid experimental evidence for the systems operation.

The first is that on the warming traces the total field is reducing as the temperature rises. (The superconductor magnetizes in opposition to the excitation field hence the total field is reduced).

The second is the large discontinuity in the warming central probe trace. This occurs when the superconductor goes normal (i.e. loses superconductivity) and hence loses magnetisation. Some of this jump will be due to the Meissner flux exclusion but as FIG. 19 (below) shows not all.

FIG. 19 shows a close up of the superconducting transition for both the cooling and warming sections. The important thing to note is that the change in flux density which occurs as the superconductor is cooled through its critical temperature and at which the Meissner flux exclusion occurs is less for both the central and off-centre probes than for when it is warmed up again. This means that the superconductor had a net magnetization which was greater than can be explained by the Meissner effect alone.

In more detail when a superconductor goes through its critical temperature flux is excluded; this is known as the Meissner effect. This can be seen in a drop in flux density in FIG. 19 as the device is cooled. If there were no magnetisation warming through the critical temperature would produce a similar rise in the measured flux density. In FIG. 19 the rise is bigger when the superconductor is warmed up meaning that magnetizing the superconductor is successful. This is a highly significant result as it demonstrates a system which is able to magnetize something using no moving parts and no current through a coil.

Figure 22B:
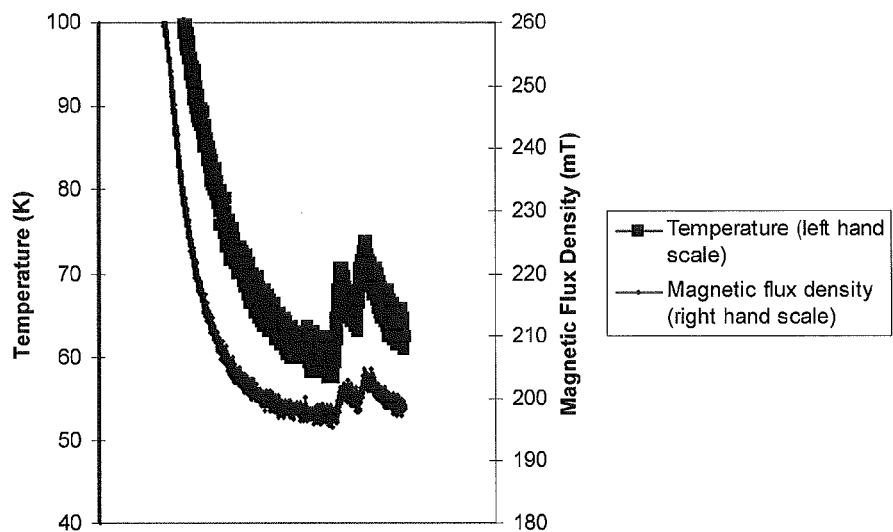

Thus referring to FIG. 20 this shows two cycles, demonstrating that more than a single pump can be applied. FIG. 21 shows a single cycle and a double cycle overlaid. FIGS. 22a and b show results from the rig run without the superconductor demonstrating that there is no evidence of "pumping" and when the rig is warmed in the same manner as before the magnetic flux density exhibits little or no hysteresis (FIG. 22b shows the evolution of temperature and flux density plotted separately to demonstrate that the temperature is being cycled).

The limit in this particular demonstrator is the Prussian Blue itself, in that, as more pumps are done the total field seen by the Prussian Blue is reducing. Hence we are moving to the left on FIG. 17 (towards the y-axis) and the change in magnetic field with temperature is decreasing. In other words the magnitude of the travelling magnetic wave is decreasing and with it the effectiveness of the pump.

However, this is not a problem when there are multiple elements since once one element is magnetized it will reinforce the field on an adjacent element. In addition in the system as it stands the first thermal wave appears to be initiated during the cooling phase. If instead the system were configured so that this occurred during the warming phase the superconductor would be magnetized in the opposite sense and the field would be increasing and therefore moving away from the y-axis. (A wave may comprise a single disturbance or step change but if one were to use a periodic wave it could be of any period and the trailing edge (if there is one) may follow milliseconds, seconds or even hours behind the leading edge).

Some of the above described embodiments refer particularly to superconducting rings but although it is believed that often circular or pseudo-circular geometry is probably the best arrangement, the configuration of the system is not restricted to this geometry and can also function with a planar wave (that is a wave travelling a substantially straight line) rather than a circular wave (that is a wave spreading in or out).

We have described, among other things, a method/system which is able to magnetize an object using no moving parts and no current through a coil. More specifically the techniques we describe facilitate the creation of high magnetic fields. There are many potential high end applications for the technology we have described, for example in the area of highly uniform, highly stable fields required for applications such as NMR, and in travelling wave and simply changing magnetic fields required for applications such as motors, generators and for magnetically switching liquid crystals for photonics. The techniques may also be used for magnetic volatile memory, and even for computers based on magnetic CMOS.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A method of changing the magnetisation of a superconductor, the method comprising automatically controlling a magnetic field to generate a wave of changing magnetic flux travelling over a surface of said superconductor, wherein the magnetism is changed while maintaining superconductivity throughout the superconductor.

2. A method as claimed in claim 1 wherein said changing comprises magnetising said superconductor, the method further comprising repeatedly applying said travelling wave of magnetic flux to said superconductor.

3. A method as claimed in claim 1 wherein said wave of magnetic flux applies a field of greater than a critical field of said superconductor to said superconductor.

4. A method as claimed in claim 1 wherein said automatic controlling comprises controlling a wave of magnetic ordering in a layer of magnetisable material over said superconductor surface.

5. A method as claimed in claim 4 wherein said material comprises a ferromagnetic or ferrimagnetic material.

6. A method as claimed in claim 4 wherein said controlling comprises controlling a current in a conductor in thermal contact with said layer of material to generate a travelling thermal wave in said conductor to control said ordering.

7. A method as claimed in claim 6 wherein said ordering occurs at an ordering temperature, and wherein said thermal wave produces a temperature change in said material which transitions from one side to the other side of said ordering temperature.

8. A method as claimed in claim 1, further comprising repeatedly applying a magnetic field of greater than a critical field of said superconductor to said superconductor.

9. A method as claimed in claim 8 wherein said superconductor is magnetised such that it has a magnetic moment at least 50% greater than said applied magnetic field.

10. A method as claimed in claim 1 further comprising using said magnetised superconductor to magnetise a second superconductor.

11. A method as claimed in claim 8 further comprising using said magnetised superconductor to magnetise a second superconductor.

* * * * *